(12) United States Patent
Irie

(10) Patent No.: US 6,842,225 B1
(45) Date of Patent: Jan. 11, 2005

(54) EXPOSURE APPARATUS, MICRODEVICE, PHOTOMASK, METHOD OF EXPOSURE, AND METHOD OF PRODUCTION OF DEVICE

(75) Inventor: Nobuyuki Irie, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/959,676

(22) PCT Filed: Apr. 11, 2000

(86) PCT No.: PCT/JP00/02345

§ 371 (c)(1),
(2), (4) Date: Jan. 8, 2002

(87) PCT Pub. No.: WO00/68738

PCT Pub. Date: Nov. 16, 2000

(30) Foreign Application Priority Data

May 7, 1999 (JP) .......................................... 11/127009

(51) Int. Cl.⁷ ........................ G03B 27/42; G03B 27/54; G03B 27/72
(52) U.S. Cl. .............................. 355/67; 355/53; 355/71
(58) Field of Search .............................. 355/53, 67, 71

(56) References Cited

U.S. PATENT DOCUMENTS

| | | | |
|---|---|---|---|
| 4,748,478 A | | 5/1988 | Suwa et al. |
| 4,853,756 A | * | 8/1989 | Matsuki ........................ 355/71 |
| 5,119,390 A | * | 6/1992 | Ohmori ........................ 372/25 |
| 5,477,304 A | * | 12/1995 | Nishi ........................ 355/53 |
| 5,486,896 A | | 1/1996 | Hazama et al. |
| 5,593,800 A | | 1/1997 | Fujioka et al. |
| 5,861,944 A | * | 1/1999 | Nishi ........................ 355/68 |
| 6,118,516 A | * | 9/2000 | Irie et al. ........................ 355/53 |
| 6,213,607 B1 | | 4/2001 | Watanabe et al. |
| 6,295,119 B1 | | 9/2001 | Suzuki |
| 6,337,162 B1 | | 1/2002 | Irie |
| 6,653,025 B2 | | 11/2003 | Nishi |
| 6,677,088 B2 | | 1/2004 | Magome et al. |
| 6,710,847 B1 | | 3/2004 | Irie |
| 2004/0032576 A1 | | 2/2004 | Kondo |

FOREIGN PATENT DOCUMENTS

| | | |
|---|---|---|
| GB | 2 299 408 A | 10/1996 |
| JP | A 63-55550 | 3/1988 |
| JP | A 4-311025 | 11/1992 |
| JP | A 6-324473 | 11/1994 |
| JP | A 10-256140 | 9/1998 |
| JP | A 2001-60546 | 3/2001 |

OTHER PUBLICATIONS

U.S. patent application Ser. No. 09/636,813, Shirato et al., filed Aug. 10, 2000.

* cited by examiner

Primary Examiner—Rodney Fuller
(74) Attorney, Agent, or Firm—Oliff & Berridge PLC

(57) ABSTRACT

A stitching type exposure apparatus for successively exposing an image of a pattern of a reticle (Ri) on different areas of a surface of a substrate (4) while overlaying parts of the same, wherein a density filter (Fj) having a light attenuating part for reducing the amount of light of overlaid parts of the image of the pattern in a sloping manner is provided in the vicinity of the reticle (Ri), the density filter (Fj) is held at a filter stage (FS) for adjusting the posture, the posture of the density filter (Fj) is detected by an illumination uniformity sensor (126) on the substrate stage (6), and the posture of the density filter (Fj) is matched with the posture of the reticle (Ri) by the filter stage (FS).

59 Claims, 16 Drawing Sheets

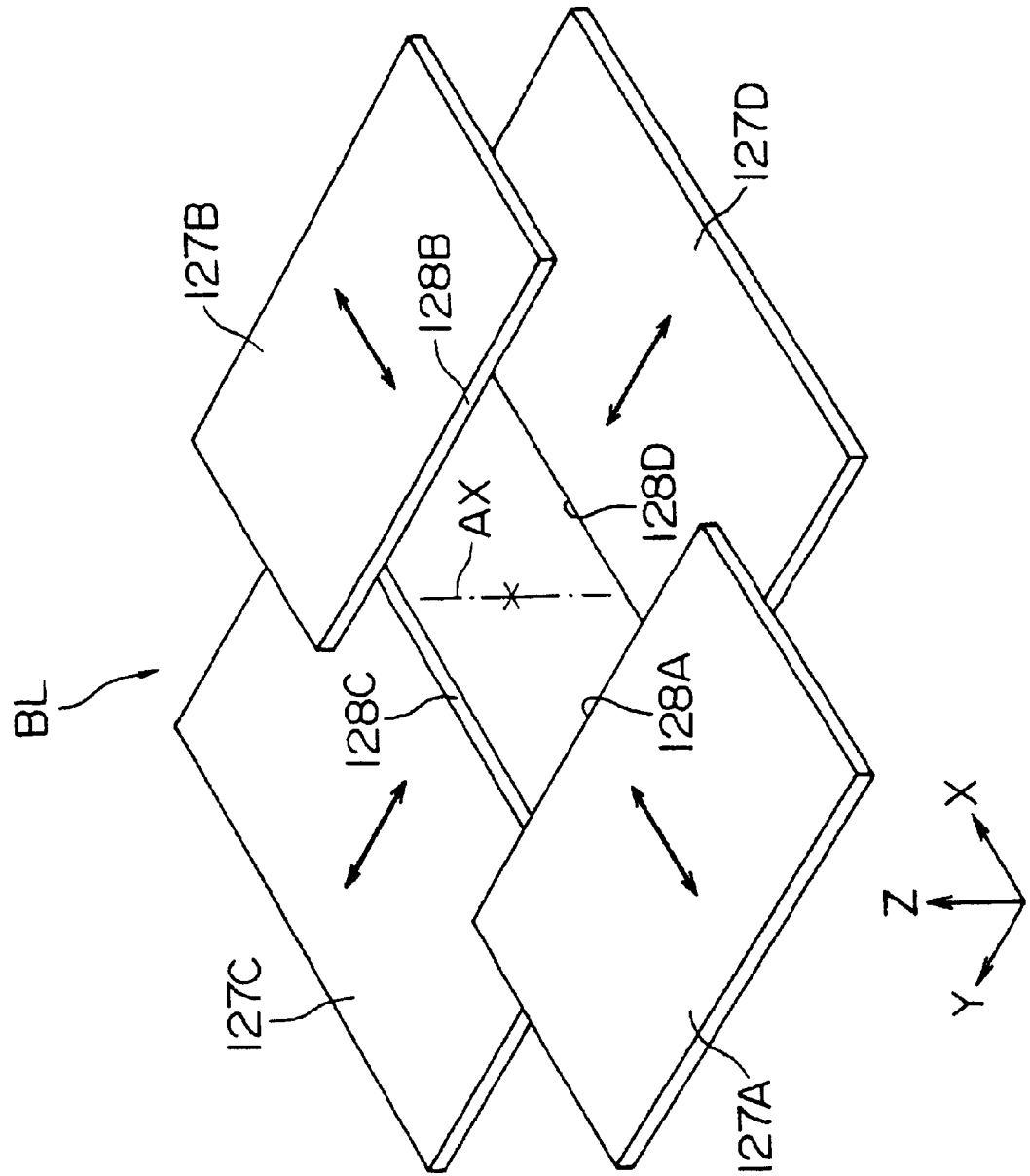

EXPOSURE APPARATUS, MICRODEVICE, PHOTOMASK, METHOD OF EXPOSURE, AND METHOD OF PRODUCTION OF DEVICE

TECHNICAL FIELD

The present invention relates to an exposure apparatus and exposure method used when producing a semiconductor integrated circuit, a liquid crystal display, a thin film magnetic head, or another microdevice or a photomask by photolithography, to a microdevice and photomask produced using such an exposure apparatus, and to a method of production of a device.

BACKGROUND ART

In photolithography, one step in the production of a microdevice, use is made of an exposure apparatus for projection exposure of an image of a pattern of a photomask or reticle on to a substrate for exposure (semiconductor wafer or glass plate coated with a photoresist). Recently, to deal with the increasing size of exposure areas accompanying the larger size of substrates etc., a stepping type exposure apparatus designed to divide the exposure areas of substrates into a plurality of unit areas (hereinafter sometimes called "shots" or "shot areas") and successively projecting and exposing corresponding images of patterns on the shots has been developed.

In such an exposure apparatus, sometimes mismatch occurs at the stitched portions of the shots due to aberration of the lenses of the projection optical system, positioning error of the mask or substrate, etc., so exposure is performed while overlaying part of the image of the pattern for one shot and the part of the image of the pattern for another shot adjoining the same. At the overlaid parts of the patterns, the amount of exposure becomes larger than the portions other than the overlaid parts, so for example the pattern width (width of lines or spaces) at the overlaid parts of the patterns formed on the substrate becomes thinner or thicker in accordance with the characteristic of the photoresist.

Therefore, the distribution of the amount of exposure of the portions becoming the overlaid parts of the shots is set in a sloping manner so that it becomes smaller the more to the outside, the amount of exposure of the overlaid parts is made equal, by two exposures, to the amount of exposure of the portions other than the overlaid parts, and therefore a change in pattern width at the overlaid parts is prevented.

As the technique for realizing a sloping distribution of the amount of exposure at the overlaid parts of the shots, it is known to form a light attenuating part for limiting in a slope the amount of transmitted light at portions of the reticle itself corresponding to the overlaid parts. Formation of a light attenuating part at the reticle itself, however, increases the number of steps of production and cost of the reticle and raises the costs of manufacturing a microdevice etc.

Therefore, a technique of providing a density filter comprised of a glass plate formed with a light attenuating part similar to the above at a position substantially conjugate with the pattern formation surface of the reticle or a technique of providing a blind mechanism having a light blocking plate (blind) able to advance and retract with respect to the optical path at a position substantially conjugate with the pattern formation surface of the reticle and advancing or retracting the light blocking plate during exposure of the substrate so as to realize such a sloping distribution of the amount of exposure have been developed.

However, it is necessary to execute the exposure processing in a state with the substrate and reticle accurately matched in relative positions, so the reticle is aligned with the substrate via a predetermined reference by a rotational function and translational function provided by a stage holding the same. This alignment is sometimes performed for each exposure of the shots.

In a conventional exposure apparatus employing a density filter, however, while the posture of the density filter can be initially adjusted, it is fixed after this initial adjustment, so when the reticle is rotated or moved translationally for alignment, a mismatch occurs with the posture of the density filter, positional deviation occurs between the portions to be reduced in light at the pattern formation surface of the mask (portions corresponding to portions forming overlaid parts on the substrate) and the image of a light attenuating part of the density filter on the pattern formation surface of the reticle, the amounts of exposure of the overlaid parts of the shots and the portions other than the overlaid parts do not become uniform, and sometimes the widths of the pattern formed on the substrate do not become uniform.

Further, since conventionally the density filter is placed at a position substantially conjugate with the pattern formation surface of the reticle in the illumination optical system, the shape of the image of the light attenuating part of the density filter at the pattern formation surface of the reticle becomes warped etc. due to distortion or other aberration of the optical system including the lenses etc. interposed between the density filter and reticle, magnification error, etc., deviations in shape occur between the portions to be reduced in light at the pattern formation surface of the mask (portions corresponding to portions forming overlaid parts on the substrate) and the image of the light attenuating part of the density filter on the pattern formation surface of the reticle, the amounts of exposure of the overlaid parts of the shots and the portions other than the overlaid parts do not become uniform, and sometimes the widths of the pattern formed on the substrate do not become uniform.

Due to the above, there was the problem that the continuity or periodicity of the patterns formed on the substrate deteriorates and the characteristics or quality of the microdevices or photomasks produced are degraded.

DISCLOSURE OF THE INVENTION

Therefore, an object of the present invention is to produce a high accuracy, high quality microdevice or photomask. Another object is to provide a step-and-stitch type exposure method and apparatus enabling a uniform cumulative amount of exposure (exposure dosage) at exposure areas on a substrate, in particular at overlaid parts of two or more shot areas with overlaid peripheries, and in turn the widths of the patterns (transferred images).

1. According to a first aspect of the present invention, there is provided an exposure apparatus for successively exposing an image of a pattern of a mask on different areas of a surface of a substrate while overlaying parts of the same, the exposure apparatus comprising a light attenuating means for reducing the amount of light of overlaid parts of the image of the pattern and a posture detection device which detects at least the posture of the light attenuating means in the rotational direction.

As the light attenuating means, it is possible to employ a density filter having a light attenuating part formed so that a portion corresponding to the overlaid part has a sloping light attenuation rate. In this case, as the posture detection device, it is possible to use one including a sensor for detection of an illumination distribution provided on a substrate stage moving the substrate and possible to detect the position of an image of the light attenuating part of the density filter on the substrate stage. Further, it is possible to provide a mark for positional measurement on the density filter and employ as the posture detection device one including a sensor for detecting the position of the mark. The mark in this case is not particularly limited, but it is possible to use an aperture or a plurality of slits formed in the light attenuating part of the density filter or another mark.

As the light attenuating means, it is possible to employ a blind mechanism including a light blocking plate provided to be able to advance and retract with respect to an optical path of the exposure light and a drive device which drives the light blocking plate during exposure so that the overlaid part becomes sloping in amount of light. Further, it is also possible to use the posture detection apparatus to detect the posture of the light attenuating means in a translational direction.

According to the present invention, since a posture detection device which detects the posture of the light attenuating means is provided, it is possible to match the posture of the light attenuating means and the posture of the mask by controlling the stage for moving the mask so that the posture of the mask matches with the posture of the light attenuating means based on the detection results.

Therefore, since it is possible to reduce the positional mismatch of the light attenuating means and the mask, there is less occurrence of positional deviation between the portions to be reduced in light at the pattern formation surface of the mask and the image of the portion for providing the light attenuating function of the light attenuating means (for example, the light attenuating part or light blocking plates) at the pattern formation surface of the mask and it is possible to improve the uniformity of the amounts of exposure of the overlaid parts of the areas (shots) and the portions other than the overlaid parts on the substrate.

Due to this, it is possible to improve the continuity (for example, the continuity in the case of connection in a direction along the lines in the case of a line-and-space (L/S) pattern) or periodicity (for example, the periodicity of the arrangement in the direction perpendicular to the lines in the case of an L/S pattern) of the connecting parts of the patterns between adjoining shots. As a result, it is possible to increase the accuracy of patterns formed on the substrate and possible to improve the characteristics or quality of the microdevices or photomasks produced.

2. According to a second aspect of the present invention, there is provided an exposure apparatus for successively exposing an image of a pattern of a mask on different areas of a surface of a substrate while overlaying parts of the same, the exposure apparatus comprising a light attenuating means which reduces the amount of light of overlaid parts of the image of the pattern in the vicinity of the mask.

In this case, the light attenuating means may be held detachably on a mask stage for moving the mask. Further, the light attenuating means may be provided either at the upstream side (light source side) or downstream side (substrate side) so long as it is in the vicinity of the mask.

As the light attenuating means, it is possible to employ a density filter having a light attenuating part formed so that a portion corresponding to the overlaid part has a sloping light attenuation rate. Further, as the light attenuating means, it is also possible to employ a blind mechanism including a light blocking plate provided to be able to advance and retract with respect to an optical path of the exposure light and a drive device which drives the light blocking plate during exposure so that the overlaid part becomes sloping in amount of light.

According to the present invention, since the light attenuating means is provided in the vicinity of the mask, no optical system including a lens etc. is interposed between the mask and light attenuating means. Compared with the case such as in the prior art where an optical system including a lens etc. is interposed between the mask and light attenuating means, it is possible to reduce the mismatch of shape due to distortion or other aberration of the optical system or error in magnification etc.

In the prior art, the shape of the image of the light attenuating part of the density filter at the pattern formation surface of the mask became warped etc. and therefore deviations in shape occurred between the portions to be reduced in light at the pattern formation surface of the mask (portions corresponding to portions forming overlaid parts on the substrate) and the image of the light attenuating part of the density filter on the pattern formation surface of the mask, but by providing the light attenuating means in the vicinity of the mask, this problem is eliminated and it is possible to improve the uniformity of the amounts of exposure of the overlaid parts of the areas (shots) and the portions other than the overlaid parts on the substrate.

Due to this, it is possible to improve the continuity (for example, the continuity in the case of connection in a direction along the lines in the case of a line-and-space (L/S) pattern) or periodicity (for example, the periodicity of the arrangement in the direction perpendicular to the lines in the case of an L/S pattern) of the connecting parts of the patterns between adjoining shots. As a result, it is possible to increase the accuracy of patterns formed on the substrate and possible to improve the characteristics or quality of the microdevices or photomasks produced.

In particular, in the case of holding the light attenuating means on the mask stage, when successively exposing the shots, there is no longer positional deviation between the mask and light attenuating means, so the accuracy of the pattern formation can be raised and there is no need for providing a mechanism for matching the positions of the mask and light attenuating means and consequently the configuration becomes simpler.

3. According to a third aspect of the present invention, there is provided an exposure apparatus for successively exposing an image of a pattern of a mask on different areas of a surface of a substrate while overlaying parts of the same, the exposure apparatus comprising a light attenuating means which reduces the amount of light of overlaid parts of the image of the pattern and an adjustment device which adjusts the posture of the light attenuating means so as to match with the posture of the mask.

As the light attenuating means, it is possible to employ a density filter formed so that a portion corresponding to the overlaid part has a sloping light attenuation rate. Further, as the light attenuating means, it is also possible to employ a blind mechanism including a light blocking plate provided to be able to advance and retract with respect to an optical path of the exposure light and a drive device which drives the light blocking plate during exposure so that the overlaid part becomes sloping in amount of light.

According to the present invention, since provision is made of an adjustment device which adjusts the posture of the light attenuating means so as to match with the posture of the mask, even when the posture of the mask is changed in accordance with the posture of the substrate, it is possible to adjust the posture of the light attenuating means to that posture of the mask changed in posture. Therefore, there is no longer any limit on matching the positional relationship between the substrate and mask, and the postures of the mask and light attenuating means can be matched.

Therefore, there is less occurrence of positional deviation between the portions to be reduced in light at the pattern formation surface of the mask and the image of the portion for providing the light attenuating function of the light attenuating means (for example, the light attenuating part or light blocking plates) at the pattern formation surface of the mask and it is possible to improve the uniformity of the amounts of exposure of the overlaid parts of the areas (shots) and the portions other than the overlaid parts on the substrate.

Due to this, it is possible to improve the continuity (for example, the continuity in the case of connection in a direction along the lines in the case of a line-and-space (L/S) pattern) or periodicity (for example, the periodicity of the arrangement in the direction perpendicular to the lines in the case of an L/S pattern) of the connecting parts of the patterns between adjoining shots. As a result, it is possible to increase the accuracy of patterns formed on the substrate and possible to improve the characteristics or quality of the microdevices or photomasks produced.

Note that in the present invention, "transferring an image of a pattern of a mask on different areas of a surface of a substrate while overlaying parts of the same" means simply multiple exposure of the overlaid parts without regard as to if pattern images are formed at overlaid parts of different areas or if there are connecting parts even if pattern images are formed.

According to a fourth aspect of the present invention, there is provided a step-and-stitch type exposure apparatus for transferring patterns on a plurality of areas with overlaid peripheries on a substrate, the exposure apparatus comprising a light attenuating device which reduces the amount of light of the overlaid parts of the plurality of areas and an adjustment device which adjusts the relative positional relationship between the distribution of the light amount defined by the light attenuating device on the substrate and the pattern.

In this case, the light attenuating means may include a density filter, and the adjustment device may include a drive device which moves at least one of a mask formed with the pattern and the density filter. Further, the density filter may be arranged away from a pattern surface of the mask or a conjugate plane of the pattern surface by exactly a predetermined distance. Further, the adjustment device may adjust the optical characteristics of an optical system arranged between the mask formed with the pattern and the light attenuating device. Further, it may further be provided with a detection device which detects a distribution of the amount of light defined by the light attenuating device or a mask pattern provided at the light attenuating device to obtain position information of the light attenuating device.

5. According to a fifth aspect of the present invention, there is provided an exposure method for transferring a pattern by a step-and-stitch system to a plurality of areas on a substrate with overlaid peripheries, the exposure method projecting on to the substrate illumination light gradually reduced in the amount of light at overlaid parts of the plurality of areas and adjusting a relative positional relationship between a distribution of the amount of the illumination light on the substrate and the pattern in accordance with a change in position of a mask formed with the pattern.

BRIEF DESCRIPTION OF THE DRAWINGS

FIG. 16 is a perspective view of principal parts of a light attenuating blind mechanism of an embodiment of the present invention.

DESCRIPTION OF THE PREFERRED EMBODIMENTS

Below, an embodiment of the present invention will be explained with reference to the drawings.

In this embodiment, the present invention is applied to a block exposure type exposure apparatus of the stitching type which produces a photomask (working reticle) by dividing an enlargement of a pattern for transfer into a plurality of patterns of parent masks and successively projecting and exposing images of the plurality of patterns of parent masks reduced by a projection optical system on the surface of a substrate while partially overlaying them so as to transfer the entirety of the pattern for transfer on to the mask substrate.

Figure 1:
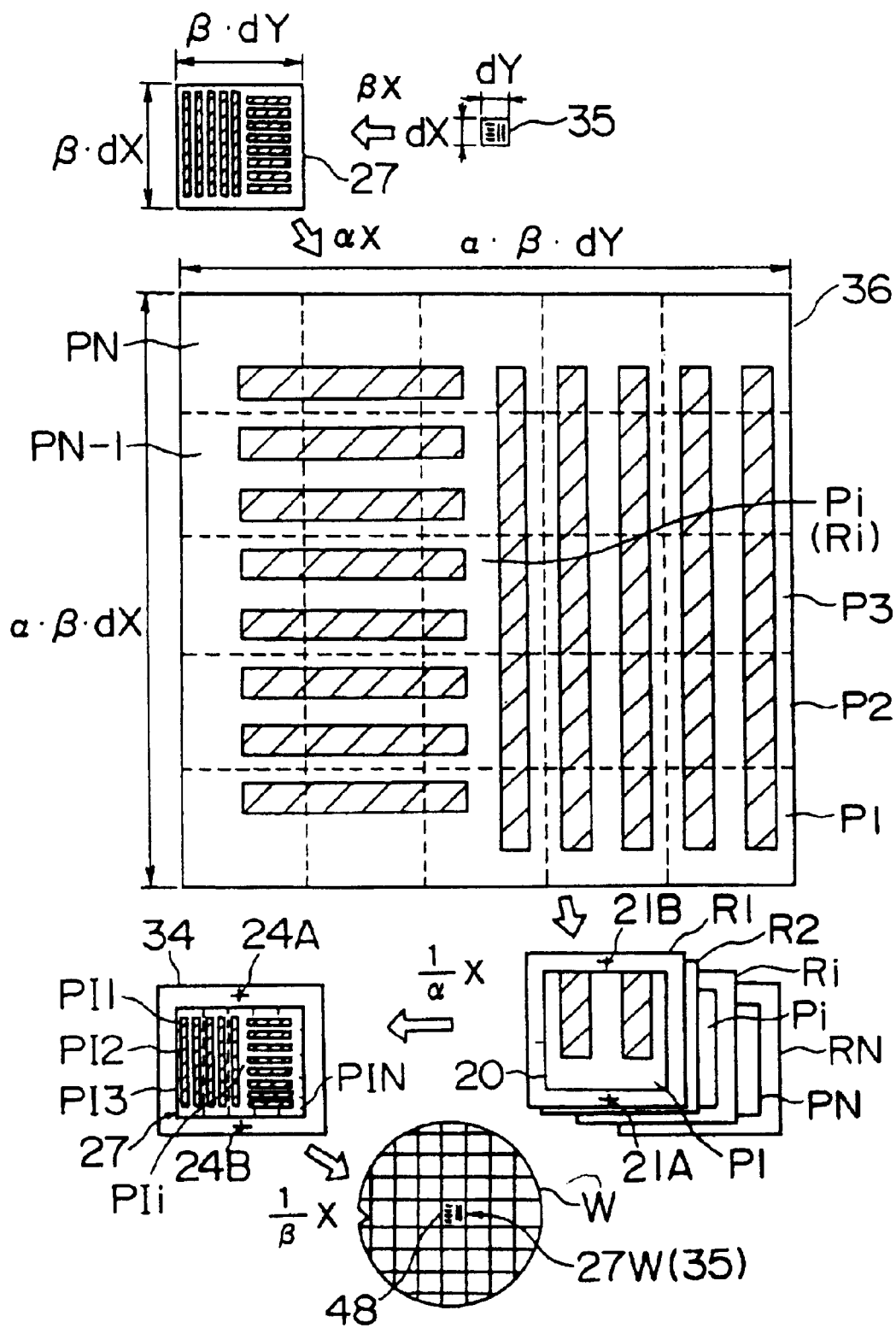
FIG. 1 is a view for explaining a process of production of a working reticle (photomask) of an embodiment of the present invention.

FIG. 1 is a view for explaining the process of production of a photomask of the present embodiment. In FIG. 1, the photomask to be produced is the working reticle 34 used when actually producing a semiconductor device. The working reticle 34 is comprised of a light transmitting substrate (blank) made of silica glass or the like on one surface of which is formed a master pattern 27 for transfer by chrome (Cr), molybdenum silicide ($MoSi_2$ etc.), or another mask material. Further, two alignment marks 24A and 24B are formed so as to straddle the master pattern 27.

The working reticle 34 is used in reduction projection of $1/\beta$ (where $\beta$ is an integer larger than 1 or a half integer etc., for example, 4, 5, or 6) through a projection optical system of an optical type projection exposure apparatus. That is, in FIG. 1, a reduced image 27W of $1/\beta$ times the master pattern 27 of the working reticle 34 is exposed on each shot area 48 of a wafer W coated with a photoresist, then developed or etched etc. to form a predetermined circuit pattern 35 on each shot area 48. Below, a method of exposure of a working reticle 34 as a photomask will be explained.

In FIG. 1, first the circuit pattern 35 of a certain layer of the semiconductor device to be finally produced is designed. The circuit pattern 35 forms various line-and-space patterns (or isolated patterns) in a rectangular area with widths of perpendicularly intersecting sides of dX and dY. In this embodiment, the circuit pattern 35 is enlarged $\beta$-times to prepare a master pattern 27 comprised of a rectangular area with widths of perpendicularly intersecting sides of $\beta \cdot dX$ and $\beta \cdot dY$ in the image data of the computer. The multiple $\beta$ is a reciprocal of the reduction rate $(1/\beta)$ of the projection exposure apparatus where the working reticle is to be used. Further, the image is inverted and enlarged at the time of inversion projection.

Next, the master pattern 27 is enlarged $\alpha$-fold ($\alpha$ is an integer larger than 1 or a half integer, for example, 4, 5, or 6) to prepare in the image data a parent pattern 36 comprised of a rectangular area with widths of perpendicularly intersecting sides of $\alpha \cdot \beta \cdot dX$ and $\alpha \cdot \beta \cdot dY$. This parent pattern 36 is then divided longitudinally and laterally into a number of sections to prepare $\alpha \times \alpha$ number of parent patterns P1, P2, P3 ..., PN ($N=\alpha^2$) in the image data. In FIG. 1, the case where $\alpha=5$ is shown. Further, the divisor $\alpha$ of the parent pattern 36 does not necessarily have to match the magnification $\alpha$ of the master pattern 27 to the parent pattern 36. Next, these parent patterns Pi (i=1 to N) are used to produce lithographic data for an electron beam lithography system (or laser beam lithography system) and these parent patterns Pi are transferred on to the master reticle Ri as parent masks at equal magnification rates.

For example, when producing one master reticle Ri, a thin film of chrome or molybdenum silicide or other mask material is formed on a light transmitting substrate of silica glass etc., an electron beam resist is coated on this, then the electron beam lithography system is used to draw an equal magnification latent image of the first parent pattern P1 on the electron beam resist. Next, the electron beam resist is developed, then is etched and the resist peeled off etc. to form the parent pattern P1 on the pattern area 20 on the master reticle R1.

At this time, alignment marks 21A and 21B comprised of two two-dimensional marks are formed in a predetermined positional relationship at the parent pattern P1. In the same way, an electron beam lithography system is used to form parent patterns Pi and alignment marks 21A and 21B on other master reticles Ri. These alignment marks 21A and 21B are used for positioning with respect to the substrate or later explained light attenuating means (light attenuating apparatus).

In this way, in the present embodiment, the parent patterns Pi drawn by the electron beam lithography system (or laser beam lithography system) are patterns of the master pattern 27 enlarged $\alpha$-times, so the amounts of the lithographic data are reduced to about $1/\alpha^2$ compared with when directly drawing the master pattern 27. Further, the minimum line width of the parent patterns Pi is $\beta$-times (for example 5-times or 4-times) the minimum line width of the master pattern 27, so the parent patterns Pi can be drawn in a short time and at a high accuracy by an electron beam lithography system using conventional electron beam resists. Further, by producing N number of master reticles R1 to RN at one time, it is possible to produce the number of necessary working reticles 34 by repeatedly using them, so the time for producing the master reticles R1 to RN does not become a large burden.

That is, the working reticle 34 is produced by using the thus produced N number of master reticles Ri and transferring the $1/\alpha$-size reduced images PIi (i=1 to N) of the parent patterns Pi of the master reticles Ri while stitching them together (while partially overlaying them).

Figure 2:
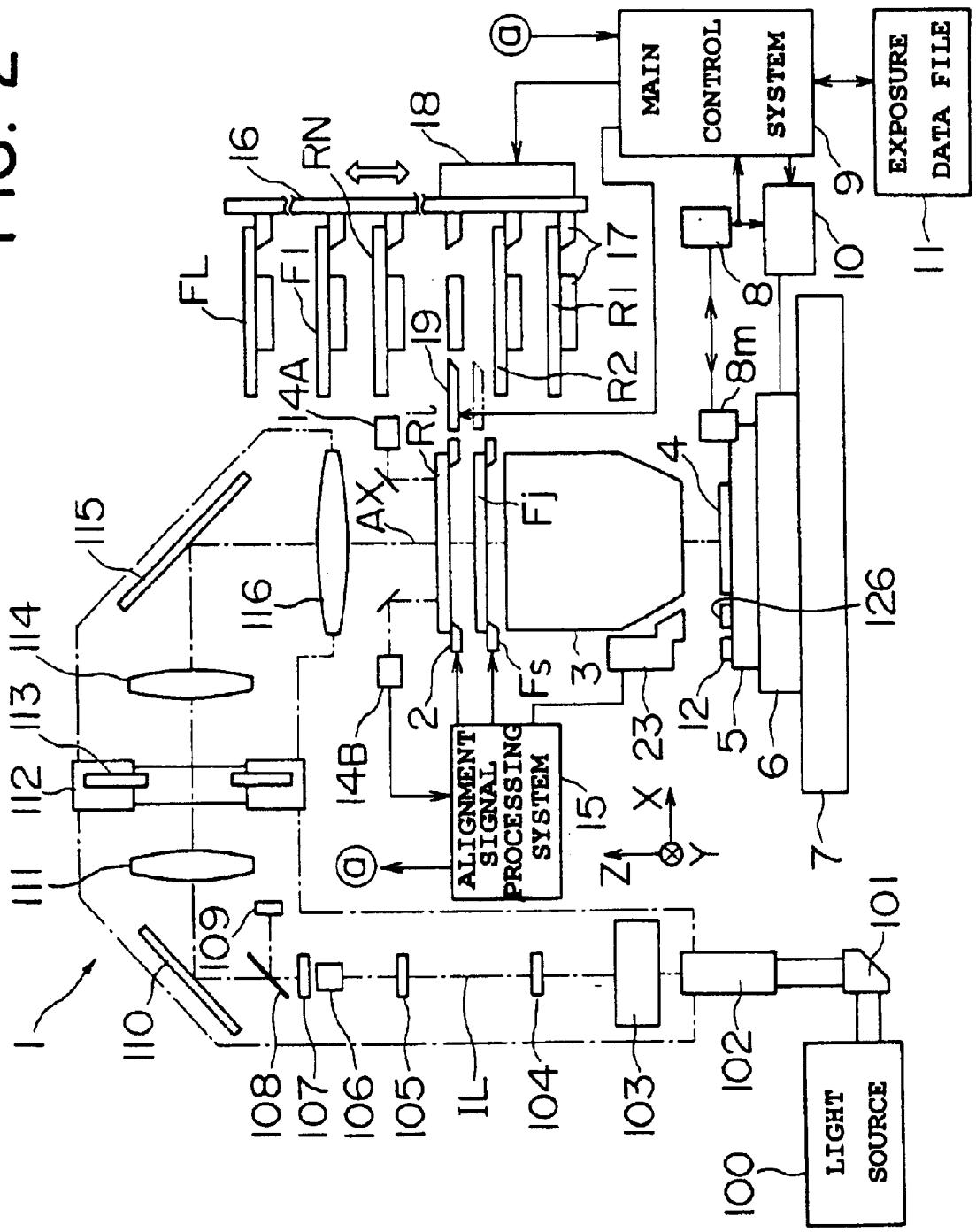
FIG. 2 is a view of the configuration of an optical type reduction projection type exposure apparatus used when producing a working reticle according to an embodiment of the present invention.

FIG. 2 shows an optical type reduction projection exposure apparatus used when producing a working reticle 34. In the figure, the ultraviolet pulse light of the light from a light source 100 (here, an ArF excimer laser) passes through a beam matching unit (BMU) 101 including movable mirrors etc. for matching of the position of the optical path with the illumination optical system 1 and enters a variable light attenuator 103 serving as a light attenuator through a pipe 102.

A main control system 9 controls the amount of exposure of the resist on the substrate 4 by communicating with the light source 100 to start and stop emission of light and control the output as determined by the oscillation wavelength and the pulse energy and to adjust the light attenuation rate of the variable light attenuator 103 with respect to the exposure light IL in stages or continuously.

The exposure light IL passing through the variable light attenuator 103 passes through a beam shaping optical system comprised of lens systems 104 and 105 arranged along a predetermined optical axis and enters an optical integrator (rod integrator or fly-eye lens etc., in the figure, a fly-eye lens). Further, two fly-eye lenses 106 may be arranged in series to enhance the uniformity of illumination distribution.

An aperture stop system 107 is arranged at the emission surface of the fly-eye lens 106. The aperture stop system 107 includes a circular aperture stop for normal illumination, an aperture stop for modified illumination comprised of a plurality of small offset apertures, an aperture stop for annular illumination, etc. arranged in a switchable manner. The illumination light IL emitted from the fly-eye lens 106 and passing through a predetermined aperture stop of the aperture stop system 107 enters a beam splitter 108 having a high transmittance and a low reflectance. The light reflected at the beam splitter 108 enters an integrator sensor 109 comprised of a photoelectric detector. The detection signal of the integrator sensor 109 is supplied through a not illustrated signal line to the main control system 9.

The transmittance and reflectance of the beam splitter 108 are measured to a high accuracy in advance and stored in a memory in the main control system 9. The main control system 9 is designed to be able to monitor the amount of exposure light IL entering the projection optical system 3 indirectly by the detection signal of the integrator sensor 109.

The exposure light IL passing through the beam splitter 108 passes via the reflection mirror 110 and condenser lens system 111 and enters a reticle blind mechanism 112. The reticle blind mechanism 112 is comprised of four movable blinds 113 (A to D) and their drive mechanisms. By setting these four blinds 113 at suitable positions, a rectangular illumination field is formed at the approximate center of the field of the projection optical system 3.

The ultraviolet pulse light IL shaped rectangularly by the blinds 113 of the reticle blind mechanism 112 pass via an imaging lens system 114, a reflection mirror 115, and a main condenser lens system 116 to strike an illuminated area similar to the rectangular aperture of the blinds 113 on the circuit pattern area of the reticle Ri by a uniform intensity distribution. That is, the plane of arrangement of the apertures of the blinds 113 is substantially conjugate with the pattern formation surface of the reticle Ri due to the combined system of the imaging lens system 114 and the main condenser lens system 116.

The ultraviolet pulse light IL emitted from the illumination optical system 1 illuminates a reticle Ri held on the reticle stage 2. The reticle stage 2 holds the i-th (i=1 to N) master reticle Ri. A filter stage FS holding a density filter as a light attenuating means is arranged in the vicinity of the further rear end side (projection optical system side) of the reticle stage 2. This filter stage FS holds the j-th (j=1 to L) density filter Fj. Details of the filter stage FS and the density filter Fj will be explained later.

The image of the pattern in the illuminated area of the master reticle Ri is projected on the surface of the substrate for the working reticle (blank) 34 at a reduction rate $1/\alpha$ ($\alpha$ is for example 5, 4, etc.) through a projection optical system 3. The substrate 4 is a light transmitting substrate comprised of silica glass etc. On the pattern area 25 of the surface (see FIG. 4) are formed alignment marks 24A and 24B formed of a thin film of chrome, molybdenum silicate, or another mask material and comprised of a couple of two-dimensional marks for positioning so as to straddle the pattern area 25.

These alignment marks 24A and 24B are formed in advance before transfer of the pattern by using an electron beam lithography system, laser beam lithography system, projection exposure apparatus (stepper, scanner), etc. Further, the surface of the substrate 4 is coated with a photoresist so as to cover the mask material. Below, the explanation will be given taking the Z-axis parallel to the optical axis AX of the projection optical system 3, the X-axis parallel to the paper surface of FIG. 2 in the plane perpendicular to the Z-axis, and the Y-axis perpendicular to the paper surface of FIG. 2.

The reticle stage 2 moves a held master reticle Ri in the XY plane in the rotational direction and translational direction. Not shown laser interferometers measure the X-coordinate, Y-coordinate, and rotational angle of the reticle stage 2. The operation of the reticle stage 2 is controlled by the measured values and the control information from the main control system 9.

On the other hand, the substrate 4 is held by no suction or soft suction on the holder comprised of three pins so that it does not deviate in position due to deformation of the substrate. The substrate holder is affixed on the substrate state 6. The sample table 5 matches the surface of the substrate 4 with the imaging plane of the projection optical system 3 by control of the focal position (position in optical axis AX direction) and angle of tilt of the substrate 4 by the auto focus system. The substrate stage 6 moves and positions the sample table 5 (substrate 4) on the base 7 in the X-direction and Y-direction by for example a linear motor.

Figure 3:
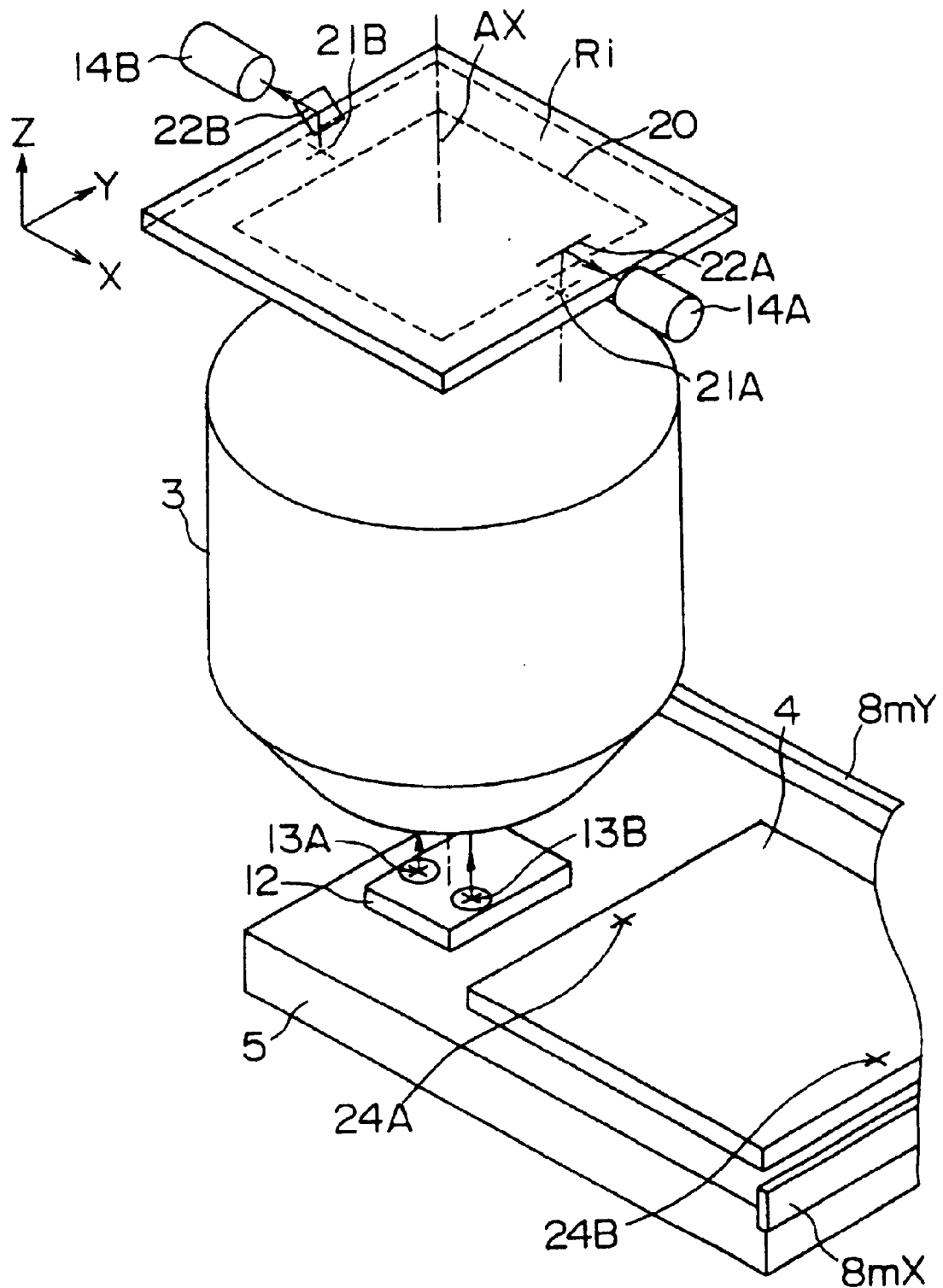
FIG. 3 is a perspective view of principal parts showing the case of alignment of a master reticle in the projection exposure apparatus of FIG. 2.

The X-coordinate, Y-coordinate, and rotational angle of the sample table 5 are measured by movable mirrors Sm affixed above the sample table 5 and laser interferometers 8 arranged facing them. The measured values are supplied to a stage control system 10 and main control system 9. "Movable mirrors $8m$" is a generic term for the X-axis movable mirror $8mX$ and the Y-axis movable mirror $8mY$ as shown in FIG. 3. The stage control system 10 controls the operation of the linear motor etc. of the substrate stage 6 based on the measured values and the control information from the main control system 9.

Further, in the present embodiment, a shelf-like reticle library 16 is arranged at the side of the reticle stage 2 and the filter stage FS. This library 16 has (N+L) number of support shelves 17 successively arranged in the Z-direction. Master reticles R1, R1, . . . , RN are carried in the reticle library of the lowest shelf to the N-th shelf, while the density filters F1, . . . , FL are carried in the filter library of the uppermost shelf to the L-th shelf.

The master reticles R1 to RN are reticles (parent masks) formed with parent patterns P1 to PN obtained by dividing the parent pattern 36 of FIG. 1. The library 16 is supported to be movable in the Z-direction by a slider 18. A loader 19 provided with an arm able to freely rotate and able to move in a predetermined range in the Z-direction (range including position corresponding to reticle stage 2 and position corresponding to filter stage FS) is arranged between the reticle stage 2 and the reticle library 16.

The main control system 9 adjusts the position of the library 16 in the Z-direction through the slider 18, then controls the operation of the loader 19 to enable transfer of desired master reticles R1 to RN between the desired support shelves 17 of the library 16 and the reticle stage 2 and to enable transfer of desired density filters F1 to FL between the desired support shelves 17 of the library 16 and the filter stage FS. In FIG. 2, the i-th master reticle Ri in the reticle library of the lowest shelf to the N-th shelf of the library 16 is held on the reticle stage 2, while the j-th density filter Fj in the filter library of the uppermost shelf to the L-th shelf of the library 16 is held on the filter stage FS.

The density filter Fj (here, the nine filters F1 to F9) is basically configured as shown in FIG. 6 and is comprised of a light transmitting substrate of silica glass or the like on which are formed a light blocking part 121 on which chrome or another light blocking material is deposited, a light transmitting part 122 on which no light blocking material is deposited, and a light attenuating part 123 on which the light blocking material is deposited while changing,the probability of presence. The light attenuating part 123 has the light blocking material deposited on it in dots. The size of the dots becomes less than the resolution limit in the state where the density filter Fj is placed at the position shown in FIG. 2. The dots are formed to increase in probability of presence so that the light attenuation rate becomes higher by a straight line the further from the inside (light transmitting part 122 side) to the outside (light blocking part 121 side). The dots may however also be formed by increasing their probability of presence so that the light attenuation rate becomes higher in a curve the further from the inside to the outside.

The dots are preferably arranged not by arrangement of dots by the same pitch P at the same transmittance portion, but by arrangement by addition to P of a random number R having a Gaussian distribution generated for each dot, that is, a P+R system. The reason is that diffracted light is produced by the arrangement of dots. In some cases, the numerical aperture (NA) of the illumination system is exceeded and light does not reach the photosensitive substrate and therefore the error from the design transmittance becomes large.

Further, the sizes of the dots are preferably all the same. The reason is that if several sizes of dots are used, when error occurs from the design transmittance due to the aforementioned diffraction, the error becomes complicated, that is, correction of the transmittance becomes complicated.

The density filter is preferably produced by a high speed electron beam lithography system so as to reduce the error in the dot shape. Further, the shape of the dots is preferably a rectangular shape (square shape) for which process errors in shape can be easily measured. This has the advantage of easy correction of the transmittance in the case of any measurable shape error.

The light blocking part 121 is formed with a plurality of alignment marks 124A and 124B at positions straddling the light transmitting part 122 and light attenuating part 123. The light blocking part 121, light transmitting part 122, and light attenuating part 123 of the density filter Fj are formed corrected in advance so that in the state held on the filter stage FS, they become the suitable shapes on the pattern formation surface in accordance with the distance (dimensions) in the direction along the optical axis AX of the projection optical system between the density filter Fj and master reticle Ri.

In the present embodiment, there are nine density filters Fj, that is, the filters F1 to F9 shown in FIG. 7A to FIG. 7I. These differ from each other in the shape or position of the light attenuating part 123 and are selectively used in accordance with whether there are portions where the images of patterns overlap between adjoining shots at the four sides of the shots to be exposed (hereinafter referred to as "stitching parts").

Figure 7A:
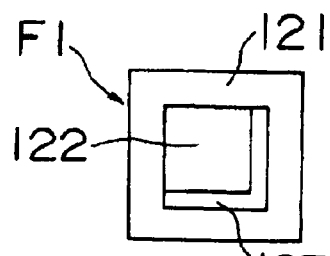
FIG. 7a to FIG. 7i are views of the configurations of nine types of density filters used in an embodiment of the present invention.
Figure 7B:
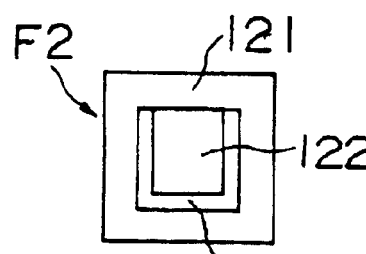
Figure 7C:
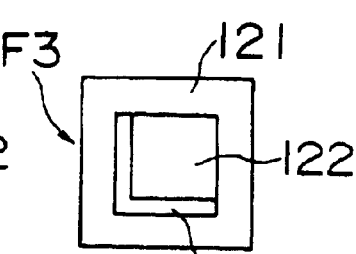
Figure 7D:
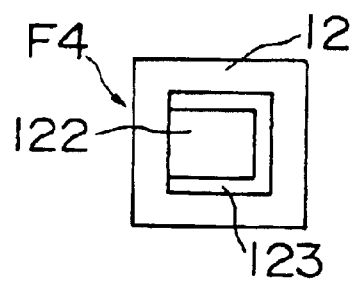
Figure 7E:
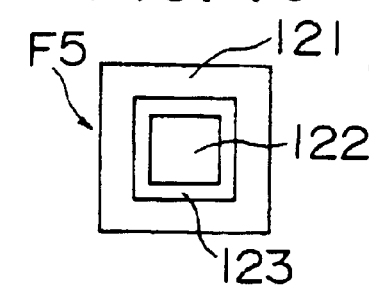
Figure 7F:
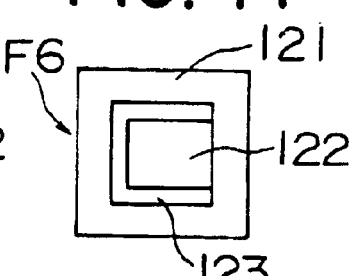
Figure 7G:
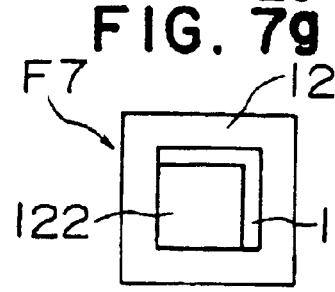
Figure 7H:
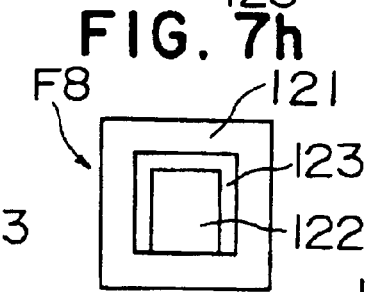
Figure 7I:
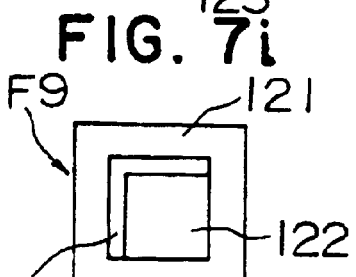

That is, in the case of a shot matrix of P (rows)×q (columns), the density filter of FIG. 7a is used for the shot (1, 1), the density filter of FIG. 7b is use for the shot (1, 2 to q-1), the density filter of FIG. 7c is used for the shot (1, q), the density filter of FIG. 7d is used for the shot (2 to p-1, 1), the density filter of FIG. 7e is used for the shot (2 to p-1, 2 to q-1), the density filter of FIG. 7f is used for the shot (2 to p-1, q), the density filter of FIG. 7g is used for the shot (p, 1), the density filter of FIG. 7h is used for the shot (p, 2 to q-1), and the density filter 7i is used for the shot (p, q).

The density filter Fj is not limited to the above nine types. It is possible to use ones having light attenuating parts 123 of other shapes in accordance with the shape of the shot areas and the shot matrix. The density filters Fj may be provided in a one-to-one correspondence with the master reticles Ri, but use of the same density filter Fj for exposure of several master reticles Ri enables the number of the density filters Fj to be reduced and is more efficient.

If the density filters Fj are made able to be used rotated 90 degrees or 180 degrees, by preparing for example the three types of density filters Fj of FIG. 7a, FIG. 7b, and FIG. 7e, the other density filters become unnecessary and efficiency is greater. Further, if the single density filter Fj shown in FIG. 7e is used and the positions of the four blinds 113 of the reticle blind mechanism 112 are selectively set or a light blocking band of the master reticle Ri is used to block one or more of the four sides of the light attenuating part 123 by the corresponding blinds 113, it is possible to realize the functions of the density filters shown in FIG. 7a to FIG. 7i and other density filters by a single density filter.

Further, the density filter Fj is not limited to one comprised of a glass substrate formed with a light attenuating part or light blocking part by chrome or another light blocking material. Use may also be made of ones using liquid crystal elements etc. to enable the positions of the light blocking parts or light attenuating parts and the light attenuating characteristics of the light attenuating parts to be changed in accordance with need. In this case, there is no longer a need to prepare several density filters and various demands in the specifications of the working reticles (microdevices) produced can be flexibly dealt with.

The filter stage FS indexes or moves the density filters Fj held in the rotational direction or translational direction in the XY plane. Not shown laser interferometers are used to measure the X-coordinate, Y-coordinate, and rotational angle of the filter stage FS. The operation of the filter stage FS is controlled by the measured values and the control information from the main control system 9.

Further, the main control system 9 has connected to it a magnetic disk drive or other storage device 11. The storage device 11 stores an exposure data file. The exposure data file records the positional relationship among the master reticles R1 to RN, the correspondence of the density filters F1 to FL with respect to the master reticles R1 to RN, the alignment information, etc.

At the time of exposure of the substrate 4, a first shot area on the substrate 4 is moved to the exposure area (projection area) of the projection optical system 3 by step motion of the substrate stage 6. In parallel with this, a master reticle R1 is loaded and held from the reticle library 16 to the reticle stage 2 through the loader 19, and a density filter F1 is loaded and held from the filter library 16 to the filter stage FS through the loader 19. The master reticle R1 and the density filter F1 are aligned etc., then a reduced image of the master reticle R1 is transferred to the corresponding shot area on the substrate 4 through the projection optical system 3.

When the reduced image of the first master reticle R1 finishes being exposed on the first shot area on the substrate 4, the next shot area on the substrate 4 is moved to the exposure area of the projection optical system 3 by step motion of the substrate stage 6. In parallel with this, the master reticle R1 on the reticle stage 2 is unloaded to the library 16 through the loader 19, the next master reticle R2 to be transferred is loaded and held from the library 16 to the reticle stage 2 through the loader 19, the density filter F1 on the filter stage FS is unloaded to the library 16 through the loader 19, and the next density filter F2 corresponding to the master reticle R2 to be transferred is loaded and held from the library 16 to the filter stage FS through the loader 19. The master reticle R2 and the density filter F2 are brought into alignment etc., then a reduced image of the master reticle R2 is projected and exposed on the corresponding shot area on the substrate 4 through the projection optical system 3.

After this, by the step-and-repeat system, reduced images of the corresponding master reticles R3 to RN are successively exposed and transferred to the remaining shot areas of the substrate 4 while suitably changing the density filters F2 to FN according to need. Note that when projecting and exposing the reduced images of the master reticles R1 to RN on the substrate 4 in this way, it is necessary to stitch the adjoining images at a high accuracy. Toward this end, it is necessary to align the master reticles Ri (i=1 to N) and the corresponding shot areas (Si) on the substrate 4 with a high accuracy. For this alignment, the projection exposure apparatus of the present embodiment is provided with reticle and substrate alignment mechanisms.

FIG. 3 shows the reticle alignment mechanism. In FIG. 3, a light transmitting fiducial mark member 12 is affixed near the substrate 4 on the sample table 5. Two cross-shaped fiducial marks 13A and 13B are for example formed at a predetermined interval in the X-direction on the fiducial mark member 12. At the bottoms of the fiducial marks 13A and 13B is placed an illumination system for illuminating the fiducial marks 13A and 13B at the projection optical system 3 side by illumination light branched from the exposure light IL. When aligning a master reticle Ri, the substrate stage 6 of FIG. 2 is driven to position the fiducial marks 13A and 13B so that the center point between the fiducial marks 13A and 13B on the fiducial mark member 12 substantially registers with the optical axis AX of the projection optical system 3 as shown in FIG. 3.

Further, for example, two cross-shaped alignment marks 21A and 21B are formed so as to straddle the pattern area 20 of the pattern surface (bottom surface) of the master reticle Ri in the X-direction. The distance between the fiducial marks 13A and 13B is set to be substantially equal to the distance between images of the alignment marks 21A and 21B reduced by the projection optical system 3. By illumination by illumination light of the same wavelength as the exposure light IL from the bottom of the fiducial mark member 12 in the state with the center point between the fiducial marks 13A and 13B substantially in register with the optical axis AX in the above way, images of the fiducial marks 13A and 13B enlarged by the projection optical system 3 are formed near the alignment marks 21A and 21B of the master reticle Ri.

Mirrors 22A and 22B are arranged above the alignment marks 21A and 21B to reflect the illumination light from the projection optical system 3 side in the ±X directions. Image processing type alignment sensors 14A and 14B are provided by a TTR (through-the-reticle) system so as to receive the illumination light reflected by the mirrors 22A and 22B. The alignment sensors 14A and 14B are each provided with an imaging system and a two-dimensional image pickup element such as a CCD camera. The image pickup elements pick up the images of the alignment marks 21A and 21B and the corresponding fiducial marks 13A and 13B and supply image signals to an alignment signal processing system 15 of FIG. 2.

The alignment signal processing system 15 processes the image signals to find the amount of positional deviation of the alignment marks 21A and 21B in the X-direction and Y-direction with respect to the fiducial marks 13A and 13B and supplies the two positional deviations to the main control system 9. The main control system 9 positions the reticle stage 2 so that the two positional deviations become symmetrical and within predetermined ranges. Due to this, the alignment marks 21A and 21B and in turn the parent pattern Pi in the pattern area 20 of the master reticle Ri (see FIG. 1) are positioned with respect to the fiducial marks 13A and 13B.

In other words, the center (exposure center) of the reduced image of the parent pattern Pi of the master reticle Ri obtained by the projection optical system 3 is positioned at the center point (substantially the optical axis AX) between the fiducial marks 13A and 13B and the perpendicularly intersecting sides of the contour of the parent pattern Pi (contour of pattern area 20) are set to be parallel to the X-axis and Y-axis. In this state, the main control system 9 of FIG. 2 stores the X-direction and Y-direction coordinates $(XF_0, YF_0)$ of the sample table 5 measured by the laser interferometers 8, whereby the alignment operation of the master reticle Ri ends. After this, it is possible to move any point on the sample table 5 to the exposure center of the parent pattern Pi.

Further, as shown in FIG. 2, an image processing type alignment sensor 23 is provided by an off-axis system at the side of the projection optical system PL to detect the position of a mark on the substrate 4. The alignment sensor 23 illuminates a detection mark by illumination light of a wide band to which the photoresist is not sensitive, picks up the image of the detection mark by a two-dimensional image pickup element such as a CCD camera, and supplies an image signal to the alignment signal processing system 15. Note that the distance (base line amount) between the detection center of the alignment sensor 23 and the center of the projected image of the pattern of the master reticle Ri (exposure center) is found in advance using a predetermined fiducial mark on the fiducial mark member 12 and stored in the main control system 9.

As shown in FIG. 3, two cross-shaped alignment marks 24A and 24B are formed at the ends of the substrate 4 in the X-direction. After the master reticle Ri is aligned, the substrate stage 6 is driven to successively move the fiducial marks 13A and 13B and the alignment marks 24A and 24B on the substrate 4 of FIG. 3 to the detection area of the alignment sensor 23 of FIG. 2 and measure the positional deviations of the fiducial marks 13A and 13B and the alignment marks 24A and 24B with respect to the detection center of the alignment sensor 23. The results of the measurements are supplied to the main control system 9. Using these measurement results, the main control system 9 finds the coordinates $(XP_0, YP_0)$ of the sample table 5 when the center point between the fiducial marks 13A and 13B is in register with the detection center of the alignment sensor 23 and the coordinates $(XP_1, YP_1)$ of the sample table 5 when the center point between the alignment marks 24A and 24B is in register with the detection sensor of the alignment sensor 23. This ends the alignment operation of the substrate 4.

Figure 4:
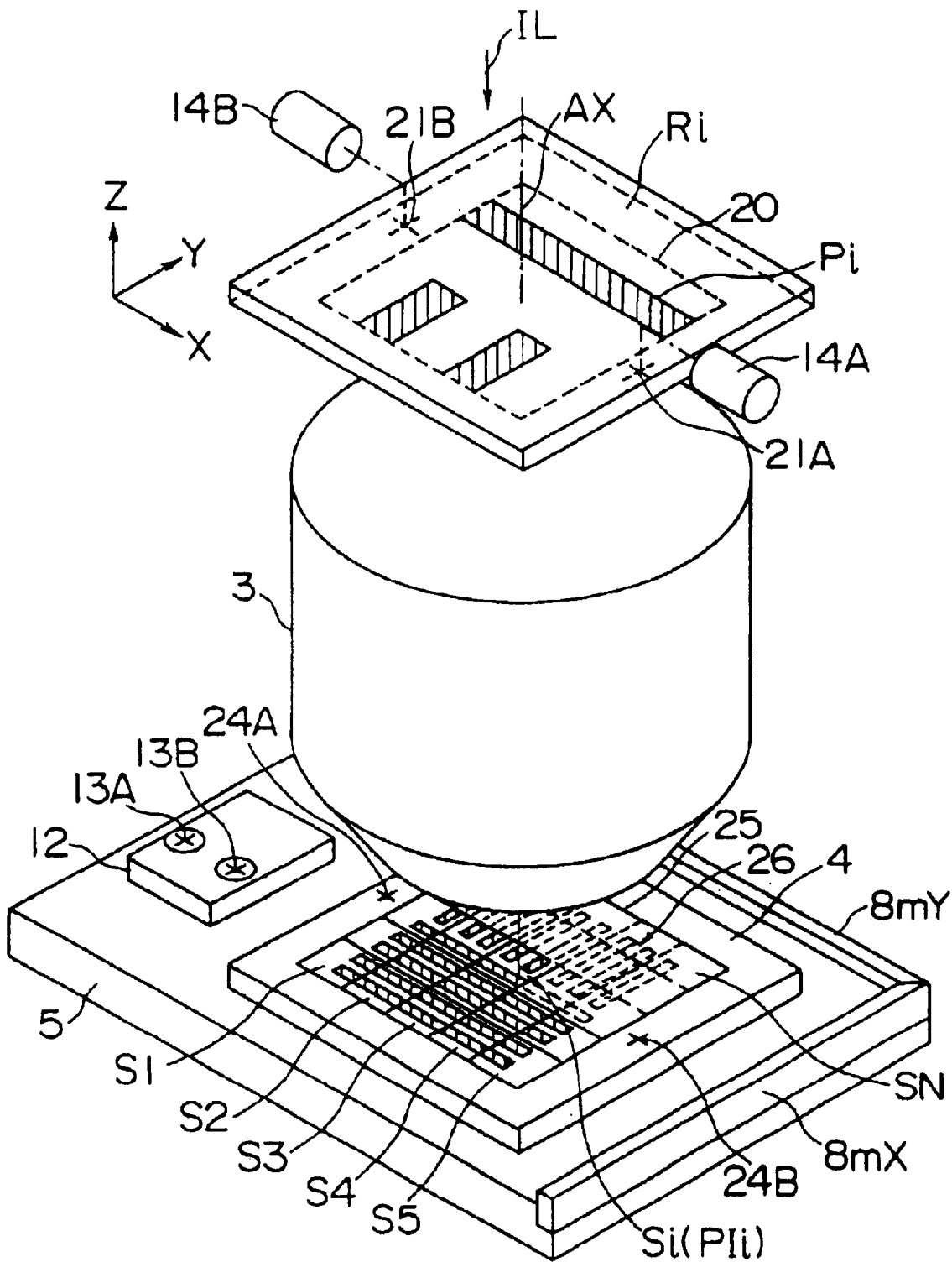
FIG. 4 is a perspective view of principal parts showing the case when projecting a reduced image of a parent pattern of a master reticle on to a substrate in the projection exposure apparatus of FIG. 2.

As a result, the distances between the center point between the fiducial marks 13A and 13B and the center point between the alignment marks 24A and 24B in the X-direction and the Y-direction become $(XP_0-XP_1, YP_0-YP_1)$. Therefore, by driving the substrate stage 6 of FIG. 2 by exactly the distances $(XP_0-XP_1, YP_0-YP_1)$ with respect to the coordinates $(XF_0, YF_0)$ of the sample table 5 at the time of alignment of the master reticle Ri, it is possible to bring the center point (center of substrate 4) between the alignment marks 24A and 24B of the substrate 4 into register with the center point (exposure center) between the projected images of the alignment marks 21A and 21B of the master reticle Ri with a high accuracy as shown in FIG. 4. From this state, the substrate stage 6 of FIG. 2 may be driven to move the sample table 5 in the X-direction and the Y-direction so as to expose a reduced image PIi of a parent pattern Pi of the master reticle Ri at a desired position with respect to the center of the substrate 4.

That is, FIG. 4 shows the state where a parent pattern Pi of an i-th master reticle Ri is reduced and transferred on to the substrate 4 through the projection optical system 3. In FIG. 4, a rectangular pattern area 25 surrounded by sides parallel to the X-axis and Y-axis is virtually set in the main control system 9 centered on the center point between the alignment marks 24A and 24B of the surface of the substrate 4. The size of the pattern area 25 is the size of the parent pattern 36 of FIG. 1 reduced to 1/α. The pattern area 25 is divided equally into a sections in the X-direction and the Y-direction to virtually set shot areas S1, S2, S3, . . . , SN ($N=\alpha^2$). The position of a shot area Si (i=1 to N) is set to the position of a reduced image PIi of the i-th parent pattern Pi when assuming reducing and projecting the parent pattern 36 of FIG. 1 through the projection optical system 3 of FIG. 4.

Note that when exposing one substrate 4, regardless of the change of the master reticle Ri, the substrate 4 is placed, without suction or with soft suction, on the sample table 5 comprised of the three pins and the substrate stage 6 is made to move by a super-low acceleration and a super-low speed so that the position of the substrate 4 does not shift at the time of exposure. The positional relationship between the fiducial marks 13A and 13B does not change during the exposure of a single substrate 4, so when exchanging the master reticles Ri, it is sufficient to position the master reticle Ri with respect to the fiducial marks 13A and 13B. There is no need to detect the positions of the alignment marks 24A and 24B on the substrate 4 for each master reticle.

If there is deviation in the positions of the density filter Fj and master reticle Ri, the amounts of exposure of the stitched parts (overlaid parts of images) between the shots no longer become uniform as a whole and do not become equal to the amounts of exposure of the portions other than the stitched parts, and the accuracy of the transferred and formed patterns deteriorates. Therefore, the projection exposure apparatus of the present embodiment is also provided with an alignment mechanism of the density filter Fj.

As the alignment mechanism of the density filter Fj, it is possible to employ one which forms posture detection marks on the density filter Fj, picks up the marks by an image pickup etc., detects the posture of the density filter Fj, and drives the filter stage FS to match the posture of the density filter Fj with the posture of the corresponding master reticle Ri.

Figure 6A:
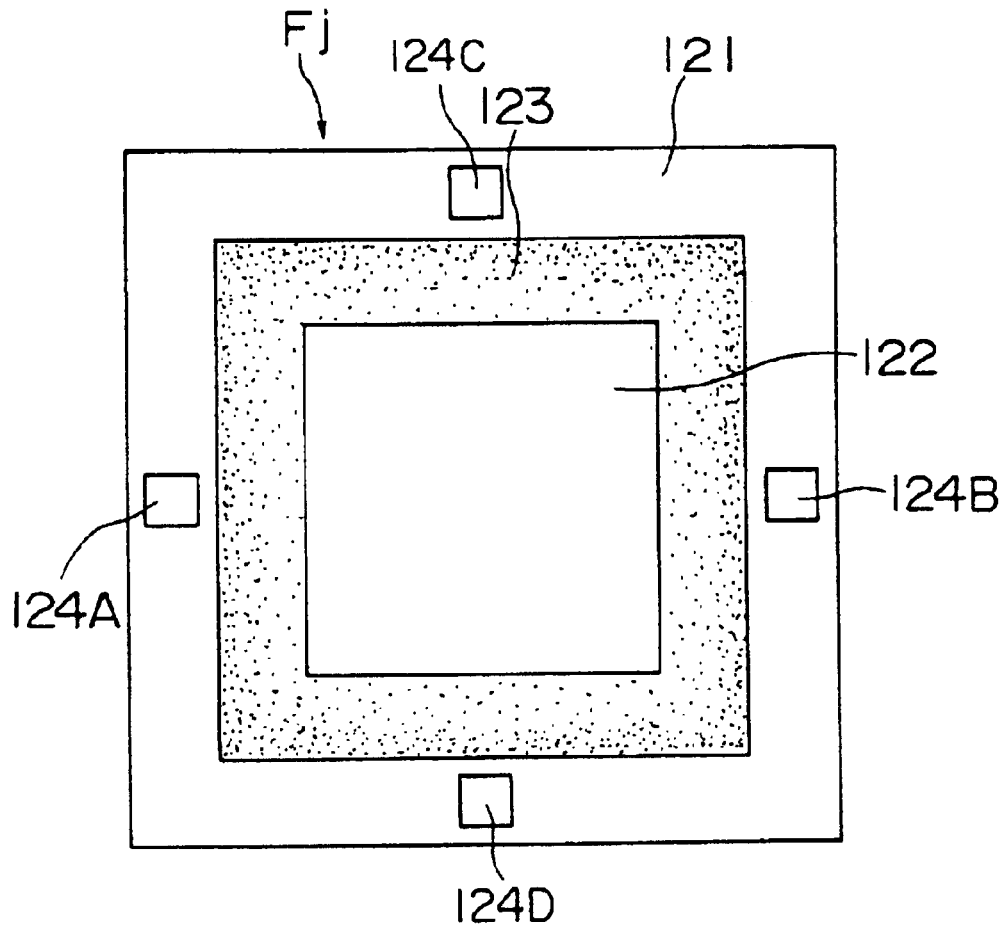
FIG. 6a is a plan view of the configuration of a density filter of an embodiment of the present invention.
Figure 6B:
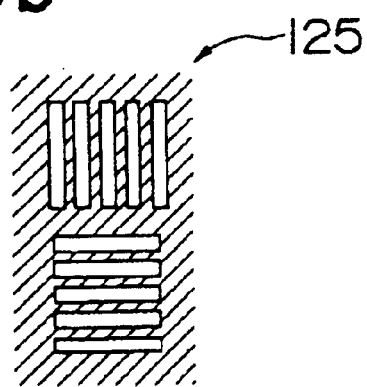
FIG. 6b is a view of an example of a mark formed on a density filter of an embodiment of the present invention.

As the marks to be formed on the density filter Fj, as shown in FIG. 6a, it is possible to remove parts of the light blocking part 121 of the density filter Fj to form rectangular or other shaped apertures (light transmitting parts) 124A, 124B, 124C, and 124D to make the marks. Further, it is also possible to use marks as shown in FIG. 6b. In FIG. 6b, a slit mark 125 comprised of a plurality of slitshaped apertures is employed. For measuring the X-direction and Y-direction positions, the slit mark 125 is comprised of a combination of a mark element comprised of slits formed in the Y-direction arrayed in the X-direction and a mark element comprised of slits formed in the X-direction arrayed in the Y-direction. The position and projection magnification of the density filter Fj are adjusted based on the results of measurement of the positional information of the marks 124A, 124B, 124C, and 124D. Further, for the position of the density filter Fj in the Z-direction and the amount of tilt in the Z-direction, the marks 124A and 124B or the mark 125 are measured at a plurality of Z-positions, the Z-position giving the greatest signal intensity or signal contrast is considered the best focus, and the density filter is placed at a position defocused by a certain amount from that best focus position.

Note that the number of marks provided in the density filter is not limited to four. It is sufficient to provide just one or more in accordance with the accuracy setting of the density filter. That is, when one-dimensional adjustment for the shift of the density filter Fj (positional deviation in the XY direction) is sufficient, one mark is sufficient. When two-dimensional adjustment including rotation is necessary, two marks are sufficient. When three-dimensional adjustment including tilt with respect to the XY plane is necessary, three or more are sufficient.

Further, in this example, the density filter was arranged so that its center substantially matched with the optical axis of the illumination optical system. Further, four marks were provided symmetrically with respect to the center (optical axis). When providing a plurality of marks at the density filter, preferably the plurality of marks are arranged so as not to be point symmetric with respect to the center or the plurality of marks are arranged point symmetrically and a separate identification pattern is formed. This is so that when arranging the density filter in the illumination optical system, measuring the energy distribution, then taking out the density filter, making corrections, and resetting it, the density filter may be corrected taking into consideration the optical characteristics (distortion etc.) of the illumination optical system, the correction becomes meaningless if the density filter is reset rotated, and the density filter can be reset to the original state.

As the marks formed on the density filter Fj, it is possible to employ ones similar to the alignment marks 21A and 21B of the above reticle Ri. As the detection system, it is possible to employ one similar to the above alignment sensors 14A and 14B. As the alignment sensors in this case, it is also possible not to provide one for the density filter but to make joint use of the reticle use alignment sensors 14A and 14B or possible to separately provide one for a density filter.

It is also possible not to form any specific marks on the density filter Fj, but to detect the shape or position of the light attenuating part 123 of the density filter Fj by the illumination distribution detection sensor 126 (so-called illumination uniformity sensor) for detecting the illumination distribution provided on the substrate stage (see FIG. 2) and identify the posture of the density filter Fj based on that information and the information relating to the density filter Fj stored and held in the exposure data file 11.

As the illumination uniformity sensor 126 in this case, it is possible to employ a two-dimensional image sensor having a light receiving surface able to detect all at once the luminance of different points in the entire region of the projection area in a state set under the projection area of the projection optical system 3. As the illumination uniformity sensor 126, however, it is also possible to employ one of another type, for example, to use a one-dimensional image sensor (linear sensor) to successively detect the luminance of different points in the entire region of the projection area while successively feeding the substrate stage 6 in the X- or Y-direction or to use a point sensor for detecting the luminance of a small area to successively detect the luminance of different points in the entire region of the projection area while successively feeding the substrate stage 6 in the X- and Y-directions.

After detecting the posture of the density filter Fj, the positional deviation (rotational angle and amount of translation etc.) with respect to the posture of the master reticle Ri adjusted in posture to match with the posture of the substrate 4 is found and the filter stage FS is operated to adjust the posture of the density filter Fj to minimize this positional deviation.

The main control system 9 drives the substrate stage 6 of FIG. 2 to match the center of the i-th shot area Si on the substrate in FIG. 4 with the exposure center of the reduced image PIi of the parent pattern Pi of the master reticle Ri found by the above alignment.

At this time, a slight rotation sometimes occurs in the substrate 4 due to the properties of the substrate stage 6, the yawing error, and other error. Therefore, a slight deviation occurs in the relative postures of the master reticle Ri and the substrate 4. This error is measured in advance or measured during actual processing and the reticle stage 2 or substrate stage 6 controlled so that the postures of the master reticle Ri and the substrate 4 are corrected to become in register so as to cancel this error out. Here, the substrate 4 is aligned with by adjusting the posture of the master reticle Ri by the reticle stage 2. Along with the adjustment of posture of the master reticle Ri, slight deviation occurs in the postures of the master reticle Ri and density filter Fj, so in the present embodiment, as explained above, the posture of the density filter Fj is detected to find the positional deviation with the reticle Ri and this is canceled out by controlling the operation of the filter stage FS to match the posture of the density filter Fj with the posture of the reticle Ri.

After this processing, the main control system 9 projects and exposes the reduced image of the parent pattern Pi on a shot area Si of the substrate 4. In FIG. 4, a reduced image of a parent pattern already exposed in the pattern area 25 of the substrate 4 is shown by a solid line, while an unexposed reduced image is shown by a broken line.

Figure 5:
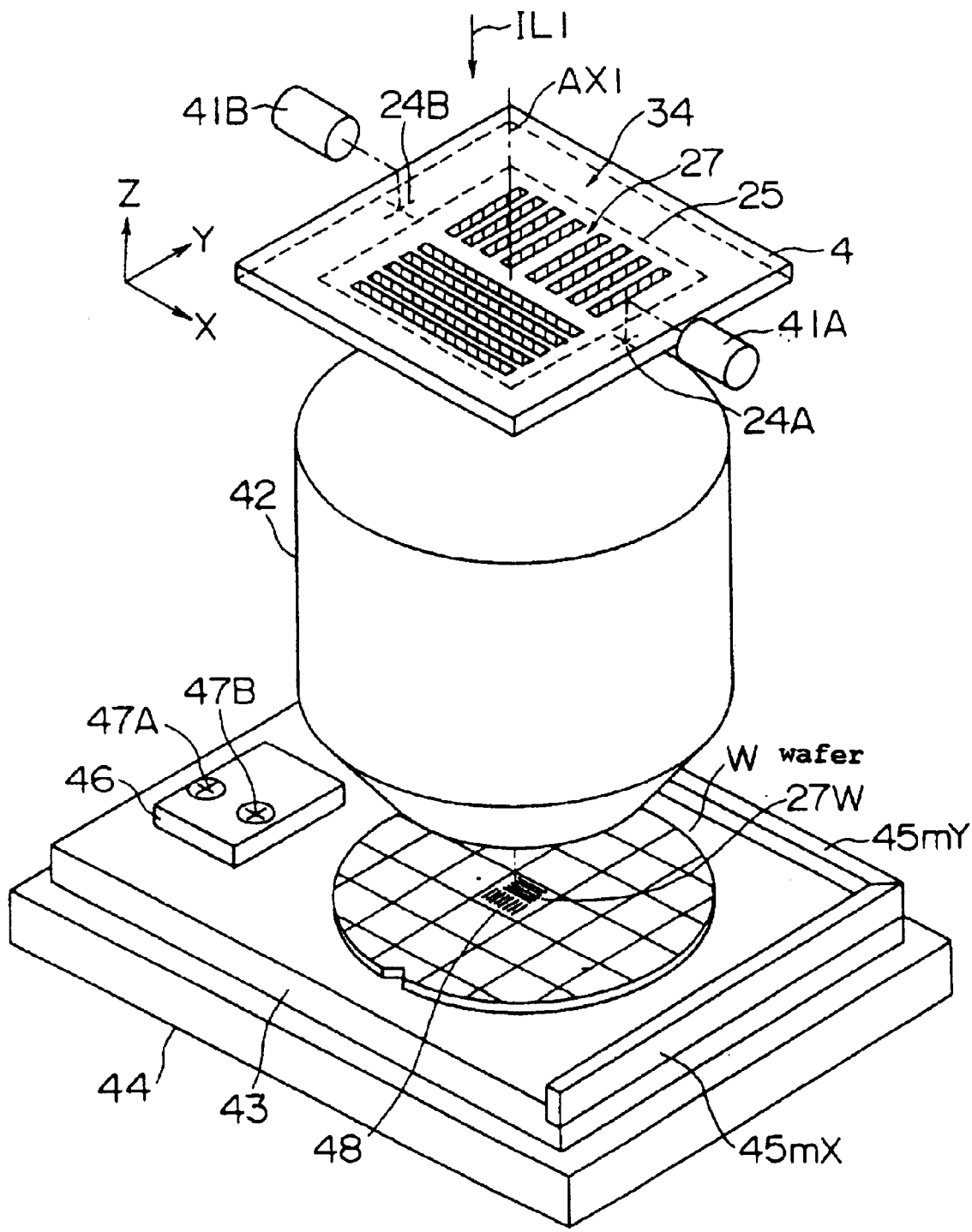
FIG. 5 is a perspective view of principal parts of a projection exposure apparatus for projecting a pattern of a working reticle produced in an embodiment of the present invention on to a wafer.

By successively exposing reduced images of parent patterns P1 to PN of the N number of master reticles R1 to RN of FIG. 2 on the corresponding shot areas S1 to SN of the substrate 4 in this way, the reduced images of the parent patterns P1 to PN are exposed while being stitched with the reduced images of the adjoining parent patterns. Due to this, the projected image 26 of the parent pattern 36 reduced to 1/α is exposed and transferred on to the substrate 4. Next, the photoresist on the substrate 4 is developed and etched and the remaining resist pattern is peeled off, whereby the projected image 26 on the substrate 4 forms the master pattern 27 as shown in FIG. 5 and the working reticle 34 is completed.

Note that when the master pattern 27 of FIG. 1 is formed with for example dense patterns and isolated patterns, sometimes one master reticle Ra among the master reticles R1 to RN will be formed with only dense patterns, while another master reticle Rb will be formed with only isolated patterns. At this time, since dense patterns and isolated patterns differ in the best illumination conditions, imaging conditions, and other exposure conditions, it is also possible to optimize the exposure conditions, that is, the shape and size of the aperture stop in the illumination optical system 1, the coherence factor (σ value), numerical aperture of the projection optical system, etc., in accordance with the parent pattern Pi for each exposure of the master reticle Ri.

At this time, when the parent pattern Pi is a dense pattern (periodic pattern), it is sufficient to employ the modified illumination method and limit the shape of the secondary light source to a annular shape or a plurality of local areas separated from the optical axis of the illumination optical system by exactly substantially equal distances. Further, to optimize the exposure conditions, it is possible to insert or remove an optical filter (so-called pupil filter) for blocking exposure light in a circular area centered about for example the optical axis in the vicinity of the pupil plane of the projection optical system 3 or jointly employ the so-called cumulative focus method (flex method) causing relative oscillation of the surface of the projection optical system 3 or surface of the substrate 4 within a predetermined range.

Further, it is possible to employ the parent mask as a phase shift mask, make the σ value of the illumination optical system for example about 0.1 to 0.4, and employ the above cumulative focus method. The photomask is not limited to a mask comprised of only a light attenuating layer of chrome etc. It may also be a spatial frequency modulation type (Shibuya-Levenson type), edge enhancement type, half tone type, or other phase shift mask. In particular, with the spatial frequency modulation type or edge enhancement type, for example a parent mask for the phase shifter is provided separately for patterning the phase shifter overlaid on the light attenuating pattern on the mask substrate.

Next, the method of measurement in the case of forming slit marks 125 comprised of a plurality of slit-shaped apertures such as shown in the above FIG. 6b in the density filter Fj will be explained. This slit marks 125 are not particularly limited in number or position, but in this embodiment, four are arranged at a light attenuating part 121.

Figure 8:
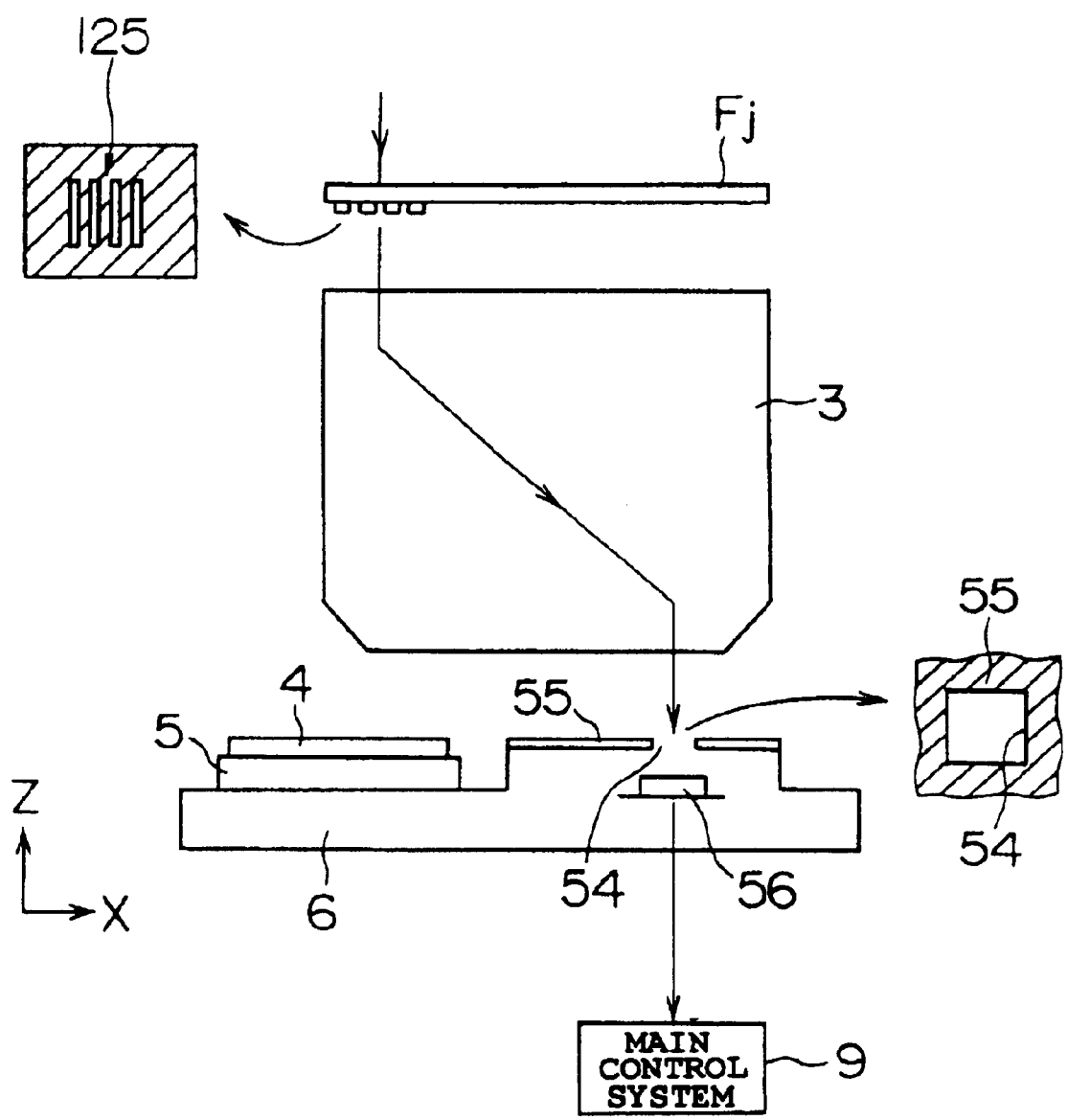
FIG. 8 is a view for explaining measurement of a slit mark of an embodiment of the present invention.

An apparatus for measuring the slit marks 125 will be explained next. In FIG. 8, the substrate stage 6 is provided with a light receiver for measuring the image of the slit marks 125 formed at the light attenuating part 121 of the density filter Fj projected by the projection optical system 3. This light receiver is comprised of a photoelectric sensor (photoelectric conversion element) 56 under a light receiving plate 55 having a rectangular (in this embodiment, square) aperture as shown in that figure. The detection signal of the photoelectric sensor 56 is input to the main control system 9. Note that it is also possible not to provide the photoelectric sensor 56 under the aperture 54, to guide the light by a light guide etc., and to detect the amount of light received by the photoelectric sensor etc. at another portion.

Figure 9A:
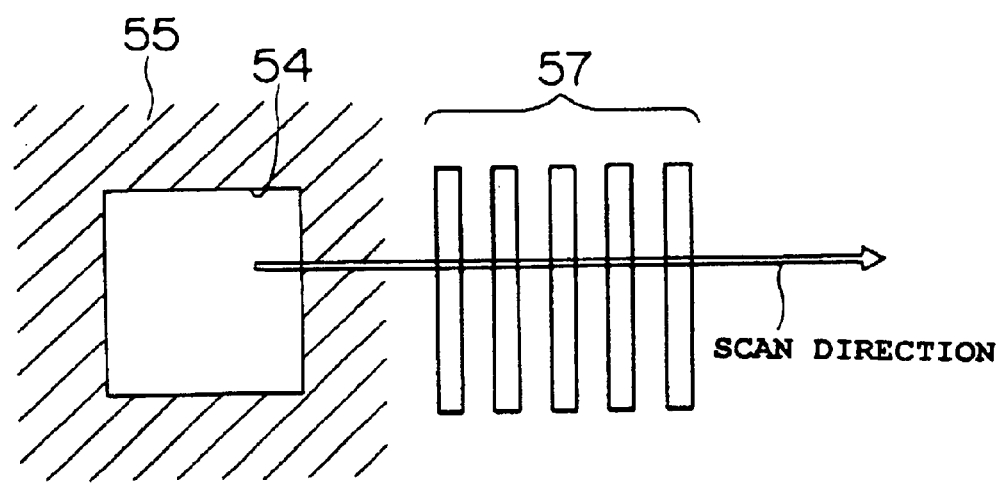
FIG. 9a is a view for explaining measurement of a slit mark of an embodiment of the present invention and showing the state of scanning a projected image of a mark.
Figure 9B:
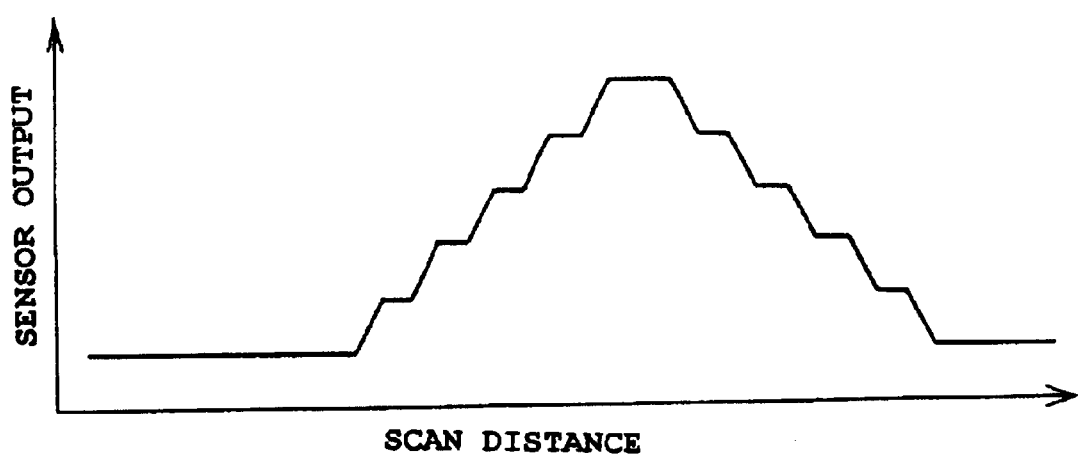
FIG. 9b is a view of the output of a photoelectric sensor for measuring a slit mark of an embodiment of the present invention.

If illuminating the density filter Fj, the image of the slit mark 125 projected by the projection optical system 3 is formed on the surface of the light receiving plate 55. In the state where the main control system 9 moves the substrate stage 6 to light receiver of the measurement device in the vicinity of a position corresponding to one projected image of the slit mark 125, by making the aperture 54 of the light receiver scan the projected image 57 as shown in FIG. 9a, the photoelectric sensor 56 detects the signal as shown in FIG. 9b. That is, the first slit image in the scan direction among the plurality of slits (light transmitting parts) of the slit mark 125 appears in the aperture 54, then the successively adjoining slit images appear in the aperture 54. After all of the slits appear in the aperture 54, they successively move out of the aperture 54. Finally, all of the slit images move outside of the aperture 54.

At this time, as shown in FIG. 9b, the output (amount of received light) of the photoelectric sensor 56 increases in steps substantially equally, peaks, then decreases in steps along with movement of the projected images 57 of the slits across the aperture 54. Therefore, by detecting the coordinate position of the substrate stage 6 at the peak position of the detection value, it is possible to measure the position of the projected image of the slit mark 125 in the X- or Y-direction.

The above method of measurement is one which drives the substrate stage 6 to scan in the X- (or Y-) direction so as to measure the position of the projected image of the slit mark 125 in the X- (or Y-) direction, but it is also possible to detect the imaging position (imaging plane) in addition to the position in the X- (or Y-) direction by moving it in the Z-direction (moving the substrate table 5 in the vertical direction) simultaneously with the scan in the X- (or Y-) direction. That is, if moving it not only in the X- (or Y-) direction, but also the Z-direction, the output of the photoelectric sensor 56 similarly becomes larger in steps as shown in FIG. 9b, but the step height is not uniform as shown in FIG. 9b. As the light receiving surface of the sensor 56 approaches the imaging position, the step height becomes greater, while as it moves away from it, the step height becomes smaller. Therefore, if differentiating the output signal of the photoelectric sensor 56 for X (or Y) and finding the Z-position where the interpolation curve connecting the plurality of peaks at the differentiated signal becomes maximum, that position is the imaging position. It is therefore possible to find the imaging position extremely easily. By measuring the imaging positions for at least three of the marks 125, it is possible to detect not only the shift or rotation of the density filter Fj, but also the tilt with respect to the XY plane and possible to adjust the posture for that tilt as well.

Note that the marks formed on the density filter Fj is not limited to the slit marks 125 suitable for measurement by this method of measurement. It is of course also possible to form diffraction grating marks or other marks. Further, instead of moving the substrate stage 6 in the X- (or Y-) direction and Z-direction, it is possible to move the substrate stage 6 to scan the projected images of the slit marks 125 at different Z-positions in the X- (or Y-) direction so as to find the imaging position, that is, the Z-position of the density filter Fj. Alternatively, instead of using the above differentiated signal, it is possible to detect the contrast of the projected images of the slit marks 125 at the different Z-positions to find the imaging position (Z-position of density filter Fj).

According to the present embodiment, since the density filter Fj is held on the filter stage FS for adjusting its posture and since the posture of the density filter Fj is detected and the posture of the master reticle Ri matched with by correcting the posture of the density filter Fj, deterioration of the continuity or periodicity at the stitched parts of the patterns transferred and formed on the substrate 4 while overlaying parts of the images of the patterns is prevented and a high accuracy, high quality working reticle (photomask) can be produced.

Figure 10A:
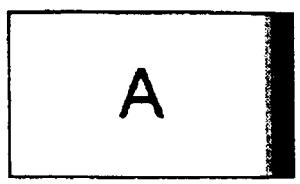
FIG. 10a to FIG. 10e are views for explaining inconveniences when not applying the present invention.
Figure 10B:
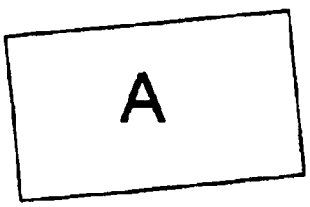
Figure 10C:
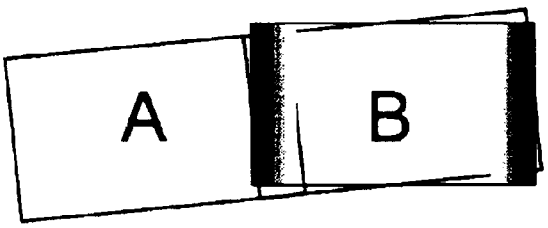
Figure 10D:
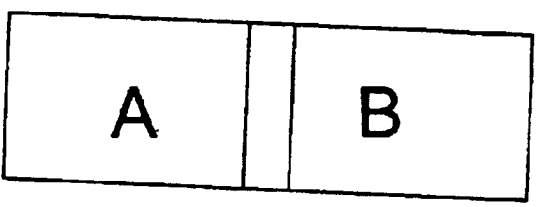
Figure 10E:
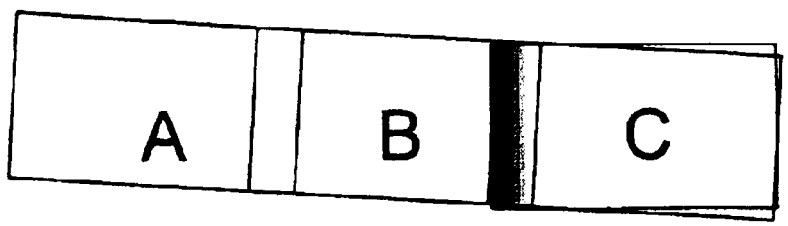

That is, if the substrate 4 is moved by the substrate stage 6 so as to expose one shot area (shot A) as shown in FIG. 10a and then expose the next shot area (shot B) as shown in FIG. 10b, sometimes a slight rotation (yawing error) occurs in the substrate stage 6 along with this. This error is corrected by slightly rotating the master reticle Ri as explained above, but, as shown in FIG. 10c, deviation occurs in the positional relationship of the density filter Fj and master reticle Ri (dose error) along with the rotation of the master reticle Ri. If exposure is performed in this state, it is not possible to obtain a suitable and uniform amount of exposure at the stitched part of the shot A and the shot B and there is deterioration of the pattern shape. As shown in FIG. 10d and FIG. 10e, the same holds true in the case of exposing the next shot area (shot C).

Figure 11A:
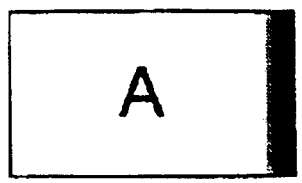
FIG. 11a to FIG. 11e are views for explaining the action and effect of an embodiment of the present invention in comparison with FIG. 10a to FIG. 10e.
Figure 11B:
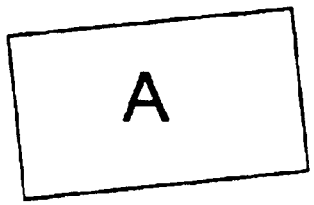
Figure 11C:
Figure 11D:
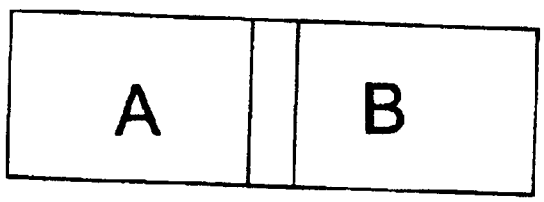
Figure 11E:
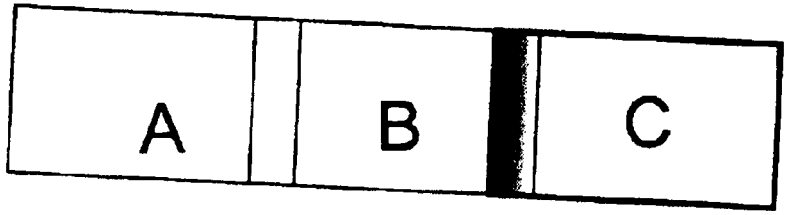

According to the present embodiment, however, to expose one shot area (shot A) as shown in FIG. 11a and then expose the next shot area (shot B) as shown in FIG. 11b, the substrate 4 is moved by the substrate stage 6. When slight rotation (yawing error) occurs in the substrate stage 6 along with this, this is canceled out by correction by slightly rotating the master reticle Ri. Further, as shown in FIG. 11c, the density filter is slightly rotated to match with the posture of the master reticle Ri after its slight rotation so as to eliminate deviation in the positional relationship (dose error). Therefore, it is possible to obtain a suitable and uniform amount of exposure at the stitched part of the shot A and the shot B and there is less deterioration of the pattern shape. As shown in FIG. 11d and FIG. 11e, the same holds true in the case of exposing the next shot area (shot C).

Next, according to the present embodiment, since the density filter Fj is provided in the vicinity of the master reticle Ri, the deterioration of the continuity or periodicity in the stitched parts of the pattern transferred and formed while parts of the images of the patterns are overlaid on the substrate 4 is prevented and a high accuracy, high quality working reticle (photomask) can be produced.

Figure 12A:
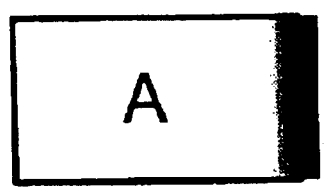
FIG. 12a to FIG. 12f are views for explaining other inconveniences when not applying the present invention.
Figure 12B:
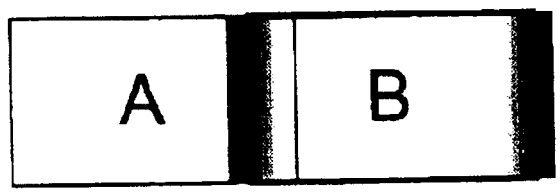
Figure 12C:
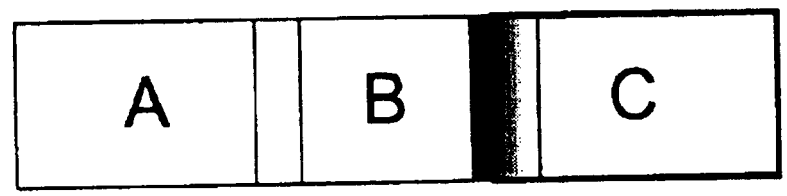

That is, when providing a density filter in the illumination optical system (position substantially conjugate with the pattern formation surface of the reticle), as shown in FIG. 12a to FIG. 12c, sometimes aberration of the optical elements interposed between the reticle and the density filter, magnification error, etc. cause deviation of the position of the image of the light attenuating part of the density filter or warping (enlargement or reduction) of the shape of the image of the light attenuating part of the density filter and an inability to obtain a suitable light attenuation rate.

Figure 12D:
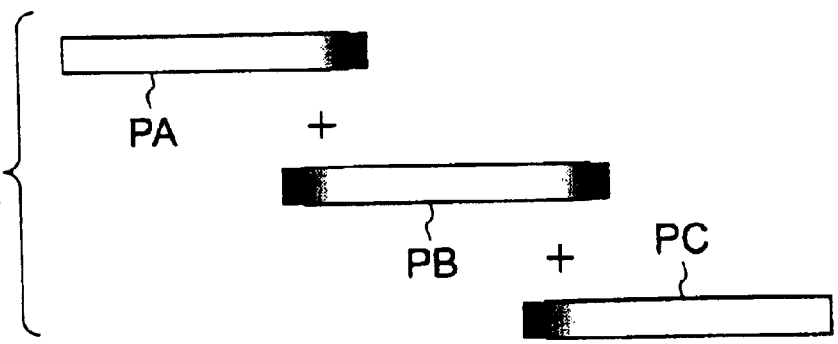
Figure 12E:
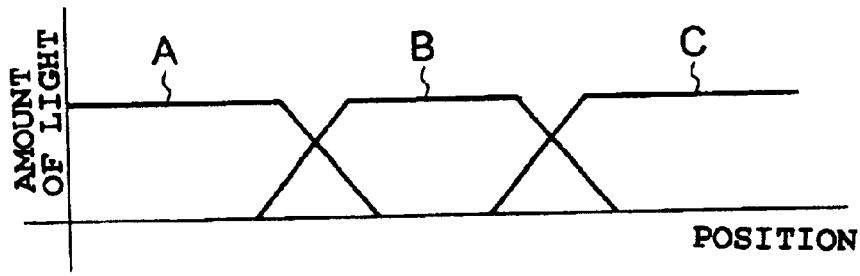
Figure 12F:
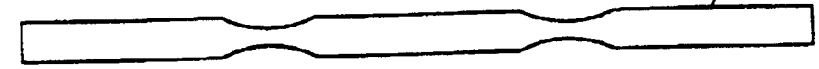

In this case, as shown in FIG. 12d and FIG. 12e, the amounts of exposure at the stitched parts of a pattern P comprised of the patterns PA, PB, and PC in shots A, B, and C (pattern extending in direction of array of the shots A, B, and C) and its vicinity do not become the suitable amounts of exposure. As a result, as shown in FIG. 12f, the pattern P formed on the substrate 4 becomes thinner (thicker) at the stitched parts and the continuity deteriorates. Further, while not illustrated, in the case of a pattern extending in the direction substantially perpendicular to the direction of array of the, shots A, B, and C, the intervals with adjoining patterns become shorter (or longer), the pattern widths became thinner (or thicker), and the periodicity of the array deteriorates.

Figure 13A:
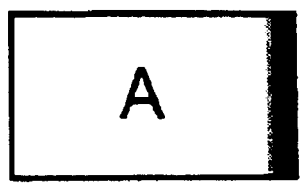
FIG. 13a to FIG. 13f are views for explaining the action and effect of an embodiment of the present invention in comparison with FIG. 12a to FIG. 12f.
Figure 13B:
Figure 13C:
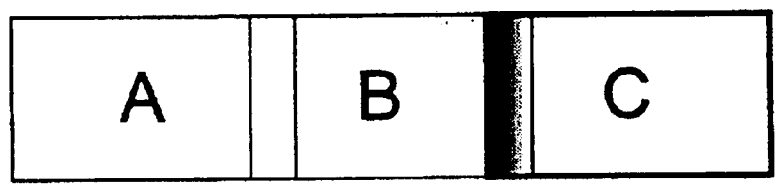
Figure 13D:
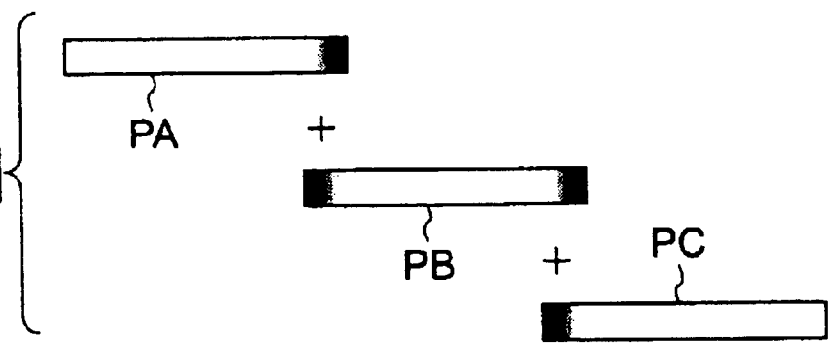
Figure 13E:
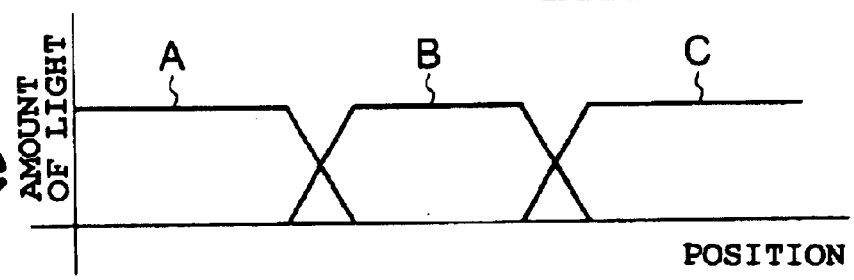
Figure 13F:
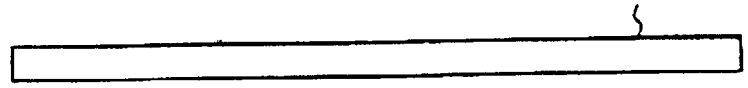

According to the present embodiment, however, the density filter Fj is positioned in the vicinity of the master reticle Ri. Since no optical elements etc. are interposed between the density filter Fj and the master reticle Ri, as shown in FIG. 13a to FIG. 13c, the position and shape of the image of the light attenuating parts 123 of the density filter Fj at the stitched parts of the shot areas (shots A, B, and C) become suitable and a suitable light attenuation rate can be obtained. Therefore, as shown in FIG. 13d and FIG. 13e, the amounts of exposure at the stitched parts of the pattern P comprised of the patterns PA, PB, and PC in the shots A, B, and C (pattern extending in direction of array of the shots A, B, and C) and their vicinities become suitable. As a result, as shown in FIG. 13f, the patterns P formed on the substrate 4 do not become thinner (thicker) at the stitched parts and the continuity is improved. While illustration is omitted, in the case of a pattern extending in a direction substantially perpendicular to the direction of array of the shots A, B, and C, the intervals with adjoining patterns no longer become shorter (or longer), the pattern widths do not become thinner (or thicker), and the periodicity of the array is improved.

In the above embodiment, the density filter Fj is set in the vicinity of the rear end side (projection optical system side) of the master reticle Ri and the master reticle Ri is set so that the pattern formation surface becomes the bottom side (projection optical system side), so there is the advantage that it is possible to bring the density filter Fj close to the pattern formation surface, but the present invention is not limited to this. It is also possible to set the position of the density filter Fj in the vicinity of the front end side (illumination optical system) of the master reticle Ri.

Figure 14:
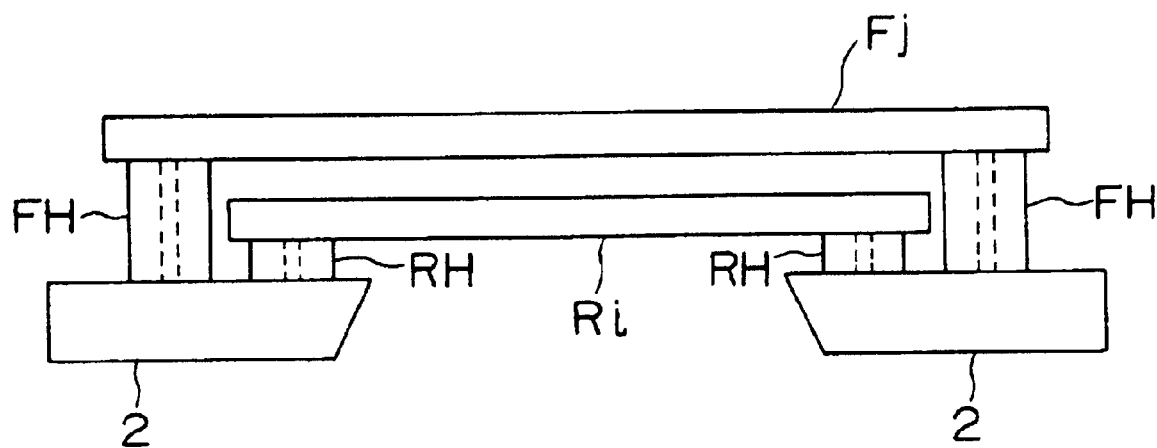
FIG. 14 is a view of an example of change of the configuration of the reticle stage of an embodiment of the present invention.

Further, to adjust the posture of the density filter Fj, the density filter Fj was made to be held by the filter stage FS, but it is not necessarily required to provide the filter stage FS independently. As shown in FIG. 14, it is possible to provide the reticle stage 2 with a filter holder FEH for holding by suction the density filter Fj in addition to the reticle holder RH for holding by suction the master reticle Ri and to hold both of the master reticle Ri and the density filter Fj at the reticle stage 2.

In this case, after detecting the posture of the density filter Fj, the posture of the density filter Fj when the posture of the density filter Fj does not match with that of the master reticle Ri may be adjusted by providing the loader 19 serving as the transport device (see FIG. 2) with a function of adjusting the posture of the density filter Fj, releasing the suction by the filter holder FH, adjusting the posture of the density filter Fj by the loader 19 in that state, then again holding by suction the filter holder FH.

By holding the master reticle Ri and the density filter Fj on the same stage 2 in this way, after the postures of the master reticle Ri and the density filter Fj are matched, no deviation will ever occur in the postures of the master reticle Ri and the density filter Fj, so by normal control for controlling the operation of the reticle stage 2 so that the posture of the master reticle Ri matches with the substrate 4, the density filter Fj simultaneously becomes matched in posture with the substrate 4 and therefore the efficiency is high.

In the case of FIG. 14, it is possible to provide the reticle stage 2 with a posture adjustment function for rotation and/or translation of the filter holder FH independent of the reticle holder RH and possible to match the posture of the density filter Fj with the posture of the master reticle Ri by this function. By doing this, by normal control for controlling the operation of the reticle stage 2 so that the posture of the master reticle Ri matches with the substrate 4, the density filter Fj is simultaneously matched in posture with the substrate 4 as well and therefore the efficiency is high.

Further, in place of the filter stage FS, it is also possible to provide a filter holder not provided with the posture adjustment function independent from the reticle stage 2. The posture of the density filter Fj in this case can be adjusted by providing a loader 19 serving as a transport device with a function of adjusting the posture of the density filter Fj in the same way as above.

Note that when there is a single density filter and no replacement is required (for example, as explained above, when using a single density filter and reticle blind mechanism 112 shown in FIG. 7e in combination or when using a density filter employing liquid crystal elements etc.), it is possible to eliminate the filter stage FS or filter holder FH having the detachment function or the filter library function or transport function and set the density filter in a fixed manner.

In this case, since it is not possible to adjust the posture of the density filter to match with the master reticle Ri, when detecting the posture of the density filter Fj and deviation is found, the operation of the reticle stage 2 is controlled to match the posture of the master reticle Ri with the posture of the density filter. At this time, the postures of the master reticle Ri and the substrate 4 are matched by controlling the operation of the substrate stage 6 to adjust the posture of the substrate 4. Even when providing the filter stage FS, it is possible to control the operation of the reticle stage 2 to match the posture of the master reticle Ri with the posture of the density filter Fj.

Note that, in the above embodiment, the shot area was made a rectangular shape, but it does not necessarily have to be a rectangular shape. It may also be a pentagon, hexagon, or other polygon in shape. Further, the shots do not have to be the same shapes and may be made different shapes or sizes. Further, the portions to be stitched do not have to be rectangular and may be zigzag strips, serpentine strips, and other shapes as well.

The above embodiment is an example of the application of both the technical idea of detecting the posture of a light attenuating means (density filter) and the technical idea of setting the position of the light attenuating means (density filter) in the vicinity of the mask. It is possible to achieve a synergistic action and effect by these, but it is also possible to achieve a corresponding action and effect even by using just one of these.

That is, the technical idea of detecting the posture of the light attenuating means can be applied regardless of the position of setting of the light attenuating means, while the technical idea of setting the position of the light attenuating means in the vicinity of the mask can be applied regardless of the application of the technical idea of detecting the posture of the light attenuating means.

Figure 15:
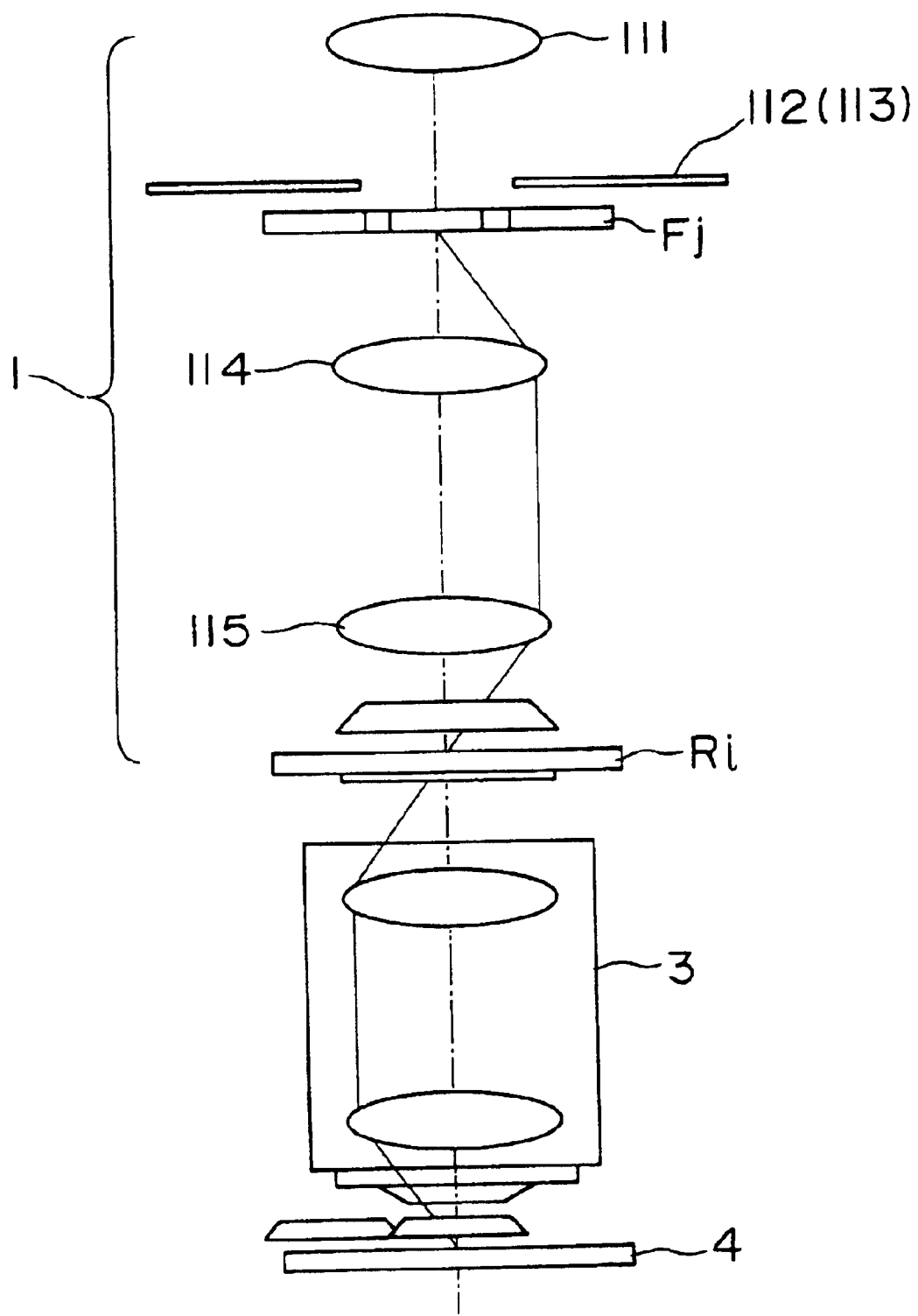
FIG. 15 is a view of an example of change of the position of a density filter of an embodiment of the present invention.

For example, as shown in FIG. 15, matching is possible by providing the density filter Fj in the vicinity of the reticle blind mechanism 112 in the illumination optical system 1, detecting the posture of the density filter Fj, and matching the posture of the master reticle Ri and the posture of the density filter Fj by adjusting one or both of the postures. Note that when providing the density filter Fj in the illumination optical system 1, the density filter Fj may be arranged at a plane conjugate with the pattern surface of the master reticle in the illumination optical system 1 or may be arranged away from the conjugate plane by exactly a predetermined distance. However, in the latter case, while it is necessary to form the light attenuating part of the density filter Fj while considering this predetermined distance, the projected images of the dots of the density filter Fj on the master reticle Ri become defocused and a drop in the illumination uniformity can be prevented, so it is desirable to employ the latter with the hardware configuration of FIG. 15.

Further, with the hardware configuration of FIG. 15, the optical elements 114 and 115 (focusing optical system) are arranged between the density filter Fj and master reticle Ri, so for example at least one of the optical elements is made movable and a mechanism is provided for adjusting the aberration of the focusing optical system or the focusing magnification, focal position, or other optical characteristics. Further, it is possible to use the adjustment mechanism alone or in combination with a mechanism for correcting at least one of the postures of the master reticle Ri and density filter Fj (as one example, the filter stage FS) and adjust the relative positional relationship between the density filter Fj (that is, its projected image) and the master reticle Ri, that is, at least one of the positional deviation in the X-, Y-, and Z-directions, the relative rotation in the XY plane, and the relative tilt, before exposure or during exposure and possible to thereby reduce the dose error at the stitched parts.

Further, in the above embodiment, employment of a density filter as the light attenuating means was illustrated, but it is also possible to use something else as the light attenuating means. For example, it is possible to achieve a similar function as with a density filter by a blind mechanism (light attenuating blind mechanism) BL.

The blind mechanism BL has basically the same configuration as the reticle blind mechanism 112 shown in FIG. 2 and is comprised of four movable blinds (light blocking plates) 127A to 127D and their drive mechanism (not shown). By setting these four blinds 127A to 127D at respectively suitable positions, a rectangular illumination field area is formed at the approximate center of the field of the projection optical system 3 by the front ends 128A to 128D of the blinds 127A to 127D.

This illumination field area is basically set to a size commensurate with the shot areas. During exposure, one or more of the four blinds 127A to 127D may be continuously moved at a predetermined speed so as to advance or retract with respect to the path of the illumination light so as to set the amount of transmitted light of the region to which the front ends 128A to 128D of the blinds 127A to 127D move to a slant.

By moving the blinds 127A to 127D at the portions corresponding to the stitched parts of the shots overall or selectively, it is possible to reduce in a slant the amount of exposure at the stitched parts the further to the outside, whereby a function similar to that of a density filter is realized. This light attenuating blind mechanism BL is somewhat complicated in configuration compared with the density filter in respect to the need for a drive mechanism for the blinds 127A to 127D, but there is no need to prepare a plurality of units and exchange them in accordance with the shots as with a density filter. This is superior in respect to the ability to flexibly deal with different situations by a single mechanism.

The light attenuating blind mechanism BL is provided in the vicinity of the master reticle Ri in place of the density filter Fj of FIG. 2. The position of provision of the light attenuating blind mechanism BL, like with the case of the above density filter Fj, may be any of the rear side or front side of the master reticle Ri. Further, in the same way as that shown in FIG. 15, it is also possible to provide the light attenuating blind mechanism BL in the vicinity of the reticle blind mechanism 112.

The posture of the light attenuating blind mechanism BL may be detected by providing marks at the light attenuating blind mechanism BL and detecting them by a pickup element etc. Further, it is also possible not to provide marks and to detect one or more of the front ends 128A to 128D of the blinds 127A to 127D.

It is possible to place the light attenuating blind mechanism BL on a stage similar to the above filter stage FS, detect the posture of the light attenuating blind mechanism BL, and control the operation of the stage to match with the posture of the master reticle Ri. However, it is also possible not to hold the light attenuating blind mechanism BL on the stage and to fix it in place. In this case, it is not possible to detect the posture of the light attenuating blind mechanism BL, then adjust the posture of the light attenuating blind mechanism BL to match with the master reticle Ri, so the reticle stage 2 is controlled to match the posture of the master reticle Ri with the posture of the light attenuating blind mechanism BL. At this time, the postures of the master reticle Ri and the substrate 4 are matched by controlling the substrate stage 6 and adjusting the posture of the substrate 4. Even if providing the blind mechanism stage, it is possible to control the reticle stage 2 and match the posture of the master reticle Ri with the posture of the light attenuating blind mechanism BL.

By holding the master reticle Ri and the light attenuating blind mechanism BL on the same stage 2 in the same way as that shown in FIG. 14, after matching the postures of the master reticle Ri and the light attenuating blind mechanism BL, there will never be deviation in the postures of the master reticle Ri and the light attenuating blind mechanism BL, so by normal control for controlling the operation of the reticle stage 2 so that the posture of the master reticle Ri matches with the substrate 4, the light attenuating blind mechanism BL is simultaneously also matched in posture with the substrate 4 and therefore the efficiency is high.

When providing the light attenuating blind mechanism BL as a light attenuating means, it is possible to replace the function of the reticle blind mechanism 112 with the light attenuating blind mechanism BL, 80 the reticle blind mechanism 121 may be omitted.

Further, in the above embodiment, the density filter Fj shown in FIG. 6a was used, but it is also possible to use a light attenuating part from which the corresponding pair of corners are cut at a slant. Here, for simplifying the explanation, in FIG. 6a, the areas (corners) where two sides of the four sides comprising the rectangular light attenuating part 123 perpendicularly intersect are designated as the bottom left corner, top left corner, bottom right corner, and top right corner and the areas (sides) of the sides other than the corners are designated as the left side, right side, top side, and bottom side.

That is, the triangular portion at the bottom left half of the bottom left corner of the light attenuating part 123 is set to a light attenuation rate of 100%, while the triangular portion of the top right half of the bottom left corner is set to a light attenuation rate which becomes higher by an inclined straight line the further to the outside in the bottom left 45 degree direction. Similarly, the triangular portion at the top right half of the top right corner is set to a light attenuation rate of 100%, while the triangular portion of the bottom left half of the top right corner is set to a light attenuation rate which becomes higher by an inclined straight line the further to the outside in the top right 45 degree direction. Regarding the light attenuating characteristics (light attenuation rate distribution) of the top left corner and bottom right corner, one of the light attenuating characteristics of the two sides comprising the top left corner and the bottom right corner is designated as the first characteristic, and the other as the second characteristic. These are set based on the characteristics of the first characteristic and second characteristic added together. By setting such light attenuating characteristics, it is possible to obtain an amount of exposure substantially equal to the portion exposed one time through the light transmitting part 122 by four exposures (strictly speaking three since the triangular portion of the bottom left half of the bottom left corner and the triangular portion of the top right half of the top right corner have 100% light attenuation rates). The light attenuating characteristics of the corners need not be set as explained above. They may also be set to complementary characteristics so that the amounts of exposures of bottom left corner, top left corner, bottom right corner, and top right corner become equal to the amount of exposure of the light transmitting part 122 by four exposures.

Further, the density filter Fj may be arranged at the image plane side of the projection optical system 3 or, when using an optical system for refocusing the intermediate image on the substrate (blank) 4, the density filter Fj may be arranged at the plane of formation of the intermediate image or away from the plane of formation by exactly a predetermined distance. In this case, at least one of the postures of the pattern image of the master reticle Ri and projected image of the density filter Fj on the substrate 4 is adjusted so that they match.

Note that the working reticle 34 is formed with not only circuit patterns, but also a bar code, symbols for identifying the reticle, alignment marks, inspection marks used for measurement of accuracy etc. (for example, box marks), etc. Therefore, it is possible to prepare separate a master reticle formed with a bar code, a master reticle formed with an identification code (alphabet, numerals, etc.), and a master reticle formed with alignment marks and to use these master reticles in common in the production of a plurality of working reticles. Further, when for example forming a plurality of chip patterns on a reticle, the chip patterns are divided by dicing lines or straight lines (hereinafter referred to as "straight lines") and alignment marks, inspection marks, etc. are formed on the straight lines. In this case, it is possible to form the marks to be formed on the straight line on a dedicated master reticle and select and transfer the necessary marks for each straight line or to form straight lines including at least one mark on a dedicated master reticle and using this master reticle to transfer the straight lines on the substrate (blank). In particular, in the latter case, sometimes the straight lines to be formed on the substrate become longer than the size of the master reticle, so it is possible to divide the straight lines into a plurality of segments and form the segments on the master reticle.

Note that, in the above embodiment, the explanation was given of a reticle exposure apparatus designed to successively stitch and transfer patterns on a blank 4 using a plurality of master reticles Ri, but the invention may be similarly applied to a device exposure apparatus (for example, an exposure apparatus for producing liquid crystal display) designed to successively stitch and transfer patterns on a device substrate using a plurality of working masks produced in the above way or produced by another method.

The step-and-stitch type projection exposure apparatus in the above embodiment was a block exposure type (stationary exposure type) designed for successive repeated block exposure of shots, but the invention may also be applied to a scan exposure type designed for successive repeated scan exposure of shots. In this case, when employing a density filter as the light attenuating means, in the same way as the above block exposure type exposure apparatus, it is possible to perform stitching without limit in the vertical and horizontal directions, but when employing a blind mechanism as the light attenuating means, it is necessary to specially set the posture etc. of the blinds. For example, when stitching in a direction perpendicular to the scan direction, scan exposure is performed in a state with the posture of the front end of a pair of facing blinds in the direction perpendicular to the scan direction out of the four blinds tilted with respect to the scan direction.

It is also possible to enlarge the device pattern to be formed on the working reticle 34, divide the enlarged device pattern into element patterns, divide these into for example dense patterns and isolated patterns, and then form them on the master reticle to thereby eliminate or reduce the stitching portions of parent patterns on the substrate 4. In this case, depending on the device pattern of the working reticle, sometimes the parent pattern of one master reticle is transferred to a plurality of areas on a substrate 4, so the number of master reticles used for production of the working reticle can be reduced. Further, it is also possible to divide the enlarged pattern into functional block units of for example a CPU, DRAM, SRAM, A/D converter, and D/A converter and form one or more functional blocks at a plurality of master reticles.

In the above embodiment, the illumination light for exposure was made ArF excimer laser light of a wavelength of 193 nm, but it is also possible to use higher ultraviolet light, for example, g-rays and i-rays, and KrF excimer laser or other distant ultraviolet (DUV) light, or $F_2$ laser (wavelength 157 nm), $Ar_2$ laser (wavelength 126 nm), and other vacuum ultraviolet (VUV) light. In a scan type exposure apparatus using an $F_2$ laser as a light source, a catiodioptic optical system is used as the projection optical system, the refraction optical members used for the illumination optical system or the projection optical system (lens elements) are all made of fluorite, the air in the laser light source, illumination optical system, and projection optical system is for example replaced by helium gas, and the space between the illumination optical system and projection optical system and the space between the projection optical system and the substrate are filled with helium gas.

Further, in an exposure apparatus using an $F_2$ laser, the reticle or density filter used is one made of fluorite, fluorine-doped silica glass, magnesium fluoride, LiF, $LaF_3$, and lithium-calcium-aluminum fluoride (LiCaAlF crystal), or rock crystal.

Further, instead of an excimer laser, it is also possible to use a harmonic of a YAG laser or other solid laser having an oscillation spectrum at any of a wavelength of 248 nm, 193 nm, and 157 nm.

Further, it is possible to use an infrared region or visible region single wavelength laser light emitted from a DFB semiconductor laser or fiber laser amplified by for example an erbium (or both erbium and yttrium) doped fiber amplifier and use the harmonic obtained by converting the wavelength to ultraviolet light using a nonlinear optical crystal.

For example, if the oscillation wavelength of the single wavelength laser is made a range of 1.51 to 1.59 μm, an 8th harmonic of an oscillation wavelength in the range of 189 to 199 nm or a 10th harmonic of an oscillation wavelength in the range of 151 to 159 μm is output. In particular, if the oscillation wavelength is made one in the range of 1.544 to 1.553 μm ultraviolet light of an 8th harmonic in the range of 193 to 194 nm, that is, a wavelength substantially the same as that of an ArF excimer laser, is obtained. If the oscillation wavelength is made one in the range of 1.57 to 1.58 μm, ultraviolet light of a 10th harmonic in the range of 157 to 158 nm, that is, a wavelength substantially the same as that of an $F_2$ laser, is obtained.

Further, if the oscillation wavelength is made one in the range of 1.03 to 1.12 μm, a 7th harmonic of an oscillation wavelength in the range of 147 to 160 nm is output. In particular, if the oscillation wavelength is made one in the range of 1.099 to 1.106 μm, ultraviolet light of a 7th harmonic in the range of 157 to 158 nm, that is, a wavelength substantially the same as that of an $F_2$ laser, is obtained. Note that as the single wavelength oscillation laser, a yttrium-doped fiber laser is used. Further, it is also possible to use light of a soft X-ray region emitted from a laser plasma light source or SOR, for example, EUV (extreme ultraviolet) light of a wavelength of 13.4 nm or 11.5 nm.

The projection optical system is not limited to a reduction system and may also be an equal magnification system or an enlargement system (for example, an exposure apparatus for producing a liquid crystal display or plasma display). Further, the projection optical system may be any of a dioptric system, a catoptric system, and a catadioptric system.

Further, the present invention may also be applied to apparatuses other than an exposure apparatus used for the production of a photomask or semiconductor device, such as an exposure apparatus transferring a device pattern on a glass plate used for the production of a display including liquid crystal display, an exposure apparatus transferring a device pattern on a ceramic wafer used for production of a thin film magnetic head, an exposure apparatus used for production of a pickup element (CCD), and the like.

In an exposure apparatus used for other than production of a photomask (working reticle), the exposure substrate (device substrate) to which the device pattern is to be transferred is held on the substrate stage 6 by vacuum or electrostatics. In an exposure apparatus using EUV rays, however, a reflection type mask is used, while in a proximity type X-ray exposure apparatus or electron beam exposure apparatus etc., a transmission type mask (stencil mask or membrane mask) is used, so a silicon wafer etc. is used as the master of the mask.

Note that the "stitching" in the specification of the present application is used in the sense including not only stitching of patterns, but also arrangement of patterns in a desired positional relationship. However, regardless of the presence of stitched portions of patterns, the shot areas to which the patterns are transferred are partially overlapped with the adjoining shot areas. That is, the overlapped parts are exposed multiple times.

The exposure apparatus of the present embodiment may be produced by assembling an illumination optical system comprised of a plurality of lenses and a projection optical system into the body of the exposure apparatus and optically adjusting them, attaching the reticle stage or substrate stage comprised of the large number of mechanical parts to the exposure apparatus body and connecting the wiring and piping, and further performing overall adjustment (electrical adjustment, confirmation of operation, etc.) Note that the exposure apparatus is desirably manufactured in a clean room controlled in temperature and cleanness etc.

The semiconductor device is produced through a step of design of the functions and performance of the device, a step of production of a working reticle by the exposure apparatus of the above embodiment based on the design step, a step of production of a wafer from a silicon material, a step of exposure and transfer of a pattern of the reticle on to a wafer using an exposure apparatus of the above embodiment, a step of assembly of the device (including dicing, bonding, and packaging), and an inspection step.

The present invention is of course not limited to the above embodiments and may be modified in various ways within the scope of the invention.

The entire content of the disclosure of japanese patent application no. 11-127009, filed on May 7, 1999, including the specification, claims, drawings, and abstract, is expressly incorporated herein by reference in its entirety.

What is claimed is:

1. An exposure apparatus which transfers a pattern of a mask onto at least one of different areas with an overlapped peripheral part on a substrate by exposing the at least one area with illumination light irradiated onto the mask, comprising:
    a light attenuating member having a filter disposed on an optical path through which the illumination light passes to reduce the amount of light on the overlapped peripheral part, the filter having an attenuating portion of which a light attenuation rate is gradually varied; and
    a detection device which detects a posture of the filter at least in a rotation direction.

2. An exposure apparatus as set forth in claim 1, wherein said filter has a light transmitting portion shaped rectangularly, and the attenuating portion is provided at an outside of the light transmitting portion.

3. An exposure apparatus as set forth in claim 2, wherein said detection device includes a sensor for detection of an illumination distribution provided on a substrate stage moving said substrate.

4. An exposure apparatus as set forth in claim 2, wherein:
    said filter has a mark for positional measurement; and
    said detection device includes a sensor for detecting the position of said mark.

5. An exposure apparatus as set forth in claim 4, wherein said mark is comprised of an aperture or a plurality of slits formed in a light blocking portion of said filter.

6. An exposure apparatus as set forth in claim 2, wherein a stage for moving the mask is controlled so that the posture of said mask becomes matched with the posture of said filter based on the detection results of said detection device.

7. An exposure apparatus as set forth in claim 1, wherein said light attenuating member includes:
    a light blocking plate provided so as to be able to advance and retract with respect to the optical path of the illumination light; and
    an actuator which drives said light blocking plate.

8. An exposure apparatus as set forth in claim 1, wherein the mask has at least one of a plurality of patterns into which a pattern obtained by enlarging a pattern to be formed on the substrate is divided, and images of the plurality of patterns reduced by a projection optical system are transferred onto the substrate.

9. A photomask produced using an exposure apparatus as set forth in claim 8.

10. An exposure apparatus as set forth in claim 1, wherein said mask is a master mask having at least one of a plurality of patterns into which a pattern obtained by enlarging a pattern to be formed on a working mask is divided, and the substrate is a mask substrate for producing the working mask onto which images of the plurality of patterns reduced by a projection optical system are transferred.

11. A microdevice produced using an exposure apparatus as set forth in claim 1.

12. An exposure apparatus as set forth in claim 1, further comprising an adjusting device which adjusts a relative positional relationship between a distribution of the amount of light defined by said light attenuating member and said pattern or image of said pattern based on the detection results of said detection device.

13. An exposure apparatus as set forth in claim 12, wherein said adjusting device performs at least one of relative movement of said light attenuating member and said mask, and adjustment of optical characteristics of an optical system arranged between said light attenuating member and said mask.

14. An exposure apparatus as set forth in claim 1, wherein said detection device detects a relative positional relationship between said light attenuating member and said mask in a direction along an optical axis substantially perpendicular to the mask.

15. An exposure apparatus as set forth in claim 1, wherein said detection device detects information on position of the filter on a predetermined plane perpendicular to an optical axis of an irradiation system forming the optical path.

16. An exposure apparatus as set forth in claim 15, wherein said detection device detects information on position of the filter in a direction along the optical axis.

17. An exposure apparatus as set forth in claim 16, wherein said detection device detects information on tilt of the filter.

18. An exposure apparatus as set forth in claim 15, wherein the irradiation system includes an illumination system which irradiates the illumination light onto the mask, and the filter is disposed at a predetermined distance from a conjugate plane with a pattern plane of the mask in a part of the illumination system.

19. An exposure apparatus as set forth in claim 18, wherein said detection device detects optical characteristics on the part of the illumination system.

20. An exposure apparatus which transfers a pattern of a mask onto at least one of different areas with an overlapped peripheral part on a substrate by exposing the at least one area with illumination light irradiated onto the mask, comprising:

an illumination system disposed on an optical path through which the illumination light passes to illuminate the mask with th illumination light; and a light attenuating member having a filter provided in a vicinity of the mask to reduce an amount of light on the overlapped peripheral part, the filter having an attenuating portion of which a light attenuation rate is gradually varied.

21. An exposure apparatus as set forth in claim 20, wherein said filter is held detachably on a mask stage for moving said mask.

22. An exposure apparatus as set forth in claim 20, wherein said filter has a light transmitting portion shaped retangularly, and the attenuating portion is provided at an outside of the light transmitting portion.

23. An exposure apparatus as set forth in claim 20, further comprising an adjusting device which detects position information of said light attenuating member and adjusts a relative positional relationship with said pattern.

24. An exposure apparatus as set forth in claim 20, wherein said light attenuating member includes:

a light blocking plate provided so as to be able to advance and retract with respect to the optical path of the illumination light; and a drive device which drives said light blocking plate during exposure so that said overlapped peripheral part has a slanted amount of light.

25. An exposure apparatus as set forth in claim 20, wherein the mask has at least one of a plurality of patterns into which a pattern obtained by enlarging a pattern to be formed on the substrate is divided, and images of the plurality of patterns reduced by a projection optical system are transferred onto the substrate.

26. A microdevice produced using an exposure apparatus as set forth in claim 20.

27. An exposure apparatus which transfers a pattern of a mask onto at least one of different areas with an overlapped peripheral part on a substrate by exposing the at least one area with illumination light irradiated onto the mask, comprising:

a light attenuating member having a filter disposed on an optical path through which the illumination light passes to reduce an amount of light on the overlapped peripheral part, the filter having an attenuating portion of which a light attenuation rate is gradually varied; and an adjusting device which adjusts posture of the filter so as to align the filter with the mask.

28. An exposure apparatus as set forth in claim 27, wherein said filter is provided in a vicinity of the mask.

29. An exposure apparatus as set forth in claim 27, wherein said filter has a light transmitting portion shaped retangularly, and the attenuating portion is provided at an outside of the light transmitting portion.

30. An exposure apparatus as set forth in claim 27, wherein said adjusting device includes a detection device for detecting a relative positional relationship between a distribution of the amount of light defined by said light attenuating member and said pattern or image of the same.

31. An exposure apparatus as set forth in claim 27, wherein said light attenuating member includes:

a light blocking plate provided so as to be able to advance and retract with respect to the optical path of the illumination light; and a drive device which drives said light blocking plate during exposure so that said overlapped peripheral part has a slanted amount of light.

32. An exposure apparatus as set forth in claim 27, wherein the mask has at least one of a plurality of patterns into which a pattern obtained by enlarging a pattern to be formed on the substrate is divided, and images of the plurality of patterns reduced by a projection optical system are transferred onto the substrate.

33. A microdevice produced using an exposure apparatus as set forth in claim 27.

34. An exposure apparatus which transfers a pattern of a mask onto at least one of different areas with an overlapped peripheral part on a substrate by exposing the at least one area with illumination light irradiated onto the mask, comprising:

a light attenuating member having an optical device in an optical path through which the illumination light passes to reduce an amount of light on the overlapped peripheral part so that a distribution of the amount of light formed on the substrate by the exposure of each area has sloped portion on the overlapped peripheral part of each area, of which the amount of light is gradually decreased; and an adjusting device which adjusts a relative positional relationship on the substrate between the sloped portion of the distribution and the transferred pattern.

35. An exposure apparatus as set forth in claim 34, wherein said light attenuating member includes a filter, and said adjusting device includes a drive device which moves at least one of the mask and said filter.

36. A exposure apparatus as set forth in claim 15, wherein said filter is arranged away from a pattern surface of said mask or a conjugate plane of said pattern surface by a predetermined distance.

37. An exposure apparatus as set forth in claim 34, wherein said adjusting device adjusts optical characteristics of an optical system arranged between the mask and said light attenuating member.

38. An exposure apparatus as set forth in claim 34, further comprises a detection device which detects a distribution of the amount of light defined by said light attenuating member or a mark pattern provided at said light attenuating member to obtain positional information of said light attenuating member.

39. An exposure apparatus as set forth in claim 34, wherein the mask has at least one of a plurality of patterns into which a pattern obtained by enlarging a pattern to be formed on the substrate is divided, and images of the plurality of patterns reduced by a projection optical system are transferred onto the substrate.

40. A microdevice produced using an exposure apparatus as set forth in claim 34.

41. An exposure apparatus as set forth in claim 34, wherein:

the optical device is provided in an illumination system which irradiates the illumination light onto the mask; and the adjusting device adjusts the relative positional relationship in accordance with a change in relative position between the optical device and the pattern on the mask.

42. An exposure apparatus as set forth in claim 34, wherein said adjusting device includes a detection device which detects position information of the optical device in an irradiation system forming the optical path.

43. An exposure apparatus as set forth in claim 42, wherein the position information includes information on rotation of the optical device on a predetermined plane perpendicular to an optical axis of the irradiation system.

44. An exposure apparatus as set forth in claim 43, wherein the position information includes information on position of the optical device in a direction along the optical axis on the irradiation system.

45. An exposure apparatus as set forth in claim 44, wherein the position information includes information on tilt of the optical device.

46. An exposure apparatus as set forth in claim 42, wherein the irradiation system includes an illumination system which irradiates the illumination light onto the mask, and the optical device is disposed at a predetermined distance from a conjugate plane with a pattern plane of the mask in a part of the illumination system.

47. An exposure apparatus as set forth in claim 46, wherein said detection device detects optical characteristics on the part of the illumination system disposed between the optical device and the mask.

48. An exposure apparatus as set forth in claim 47, wherein said adjusting device adjusts at least one of the optical device and the illumination system based on information detected by said detection device to adjust the relative positional relationship.

49. An exposure method of transferring a pattern of a mask onto at least one of different areas with an overlapped peripheral part on a substrate by exposing the at least one area with illumination light irradiated onto the mask comprising:

reducing an amount of light on the overlapped peripheral part so that a distribution of the amount of light formed on the substrate by the exposure of each area has a sloped portion on the overlapped peripheral part of each area, of which the amount of light is gradually decreased; and adjusting a relative positional relationship on the substrate between the sloped portion of the distribution and the transferred pattern.

50. A photomask produced using an exposure method as set forth in claim 49.

51. A method of producing a device including a step of transferring onto a photosensitive substrate a circuit pattern formed on a photomask as set forth in claim 50.

52. An exposure method as set forth in claim 49, wherein:

the amount of the illumination light is reduced at an up stream side of the mask; and the relative positional relationship is adjusted in accordance with a change in position of the pattern.

53. An exposure method as set forth in claim 49, wherein position information of an optical device setting the distribution of the amount of light in an irradiation system through which the illumination light passes is detected to adjust the relative positional relationship.

54. An exposure method as set forth in claim 53, wherein the position information includes information on rotation of the optical device on a predetermined plane perpendicular to an optical axis of the irradiation system.

55. An exposure method as set forth in claim 54, wherein the position information includes information on position of the optical device in a direction along the optical axis of the irradiation system.

56. An exposure method as set forth in claim 55, wherein the position information includes information on tilt of the optical device.

57. An exposure method as set forth in claim 53, wherein the irradiation system includes an illumination system which irradiates the illumination light onto the mask, and the optical device is disposed at a predetermined distance from a conjugate plane with a pattern plane of the mask in a part of the illumination system.

58. An exposure method as set forth in claim 57, wherein optical characteristics of the part of the illumination system disposed between the optical device and the mask are detected.

59. An exposure method as set forth in claim 58, wherein at least one of the optical device and the part of the illumination system is adjusted based on the detected information to adjust the relative positional relationship.

* * * * *